US008687352B2

(12) United States Patent
Hayakawa et al.

(10) Patent No.: US 8,687,352 B2
(45) Date of Patent: Apr. 1, 2014

(54) VIDEO DISPLAY DEVICE, AND ELECTRONIC DEVICE

(75) Inventors: Hideo Hayakawa, Edogawa-ku (JP); Mitsuyoshi Takao, Hidaka (JP)

(73) Assignee: Kabushiki Kaisha Toshba, Tokyo (JP)

( * ) Notice: Subject to any disclaimer, the term of this patent is extended or adjusted under 35 U.S.C. 154(b) by 54 days.

(21) Appl. No.: 13/294,143

(22) Filed: Nov. 10, 2011

(65) Prior Publication Data

US 2012/0224347 A1    Sep. 6, 2012

(30) Foreign Application Priority Data

Mar. 1, 2011   (JP) ................................. 2011-044427

(51) Int. Cl.
*G06F 1/16*    (2006.01)
(52) U.S. Cl.
USPC ............ 361/679.22; 361/679.06; 361/679.04; 361/679.05; 361/679.07; 361/679.21; 248/917
(58) Field of Classification Search
USPC ........ 248/372.1, 162.1, 123.11, 299.1, 124.1, 248/122.1, 371, 91, 7; 361/679.06, 679.04, 361/679.05, 679.07, 679.22, 679.21
See application file for complete search history.

(56) References Cited

U.S. PATENT DOCUMENTS

| | | | |
|---|---|---|---|
| 5,904,328 A * | 5/1999 | Leveridge et al. ......... | 248/124.1 |
| 6,561,469 B1 | 5/2003 | Masuda et al. | |
| 6,575,419 B1 | 6/2003 | Masuda et al. | |
| 6,929,224 B1 | 8/2005 | Masuda et al. | |
| 8,002,223 B2 | 8/2011 | Sawai et al. | |
| 2003/0173476 A1 | 9/2003 | Masuda et al. | |
| 2004/0217244 A1 * | 11/2004 | Wu et al. ..................... | 248/278.1 |
| 2010/0008032 A1 * | 1/2010 | Wang ....................... | 361/679.22 |

FOREIGN PATENT DOCUMENTS

| | | |
|---|---|---|
| JP | 2001-034179 A | 2/2001 |
| JP | 2003-271066 A | 9/2003 |
| JP | 2004-229051 | 8/2004 |
| JP | 2006-333129 | 12/2006 |
| JP | 2007-010989 | 1/2007 |

(Continued)

OTHER PUBLICATIONS

Notice of Rejection mailed by Japan Patent Office on Feb. 28, 2012 in the corresponding Japanese patent application No. 2011-044427.

(Continued)

*Primary Examiner* — Tuan T Dinh
*Assistant Examiner* — Steven T Sawyer
(74) *Attorney, Agent, or Firm* — Knobbe, Martens, Olson & Bear LLP

(57) ABSTRACT

According to one embodiment, a video display device includes a housing, a display device, a rotating support portion, and a support portion. The housing includes a first wall with a first opening and a second wall located opposite the first wall. The display device is housed in the housing and includes a display screen exposed from the first opening. The rotating support portion rotatably supports the display device. The support portion includes a first end to be placed, a second end located opposite the first end and connected to the rotating support portion, a linking portion extending between a first position close to the first wall and a second position close to the second wall, and a second opening between the first end and the second end. The support portion supports the rotating support portion to be apart from a plane where the video display device is placed.

1 Claim, 24 Drawing Sheets

(56) References Cited

FOREIGN PATENT DOCUMENTS

| | | |
|---|---|---|
| JP | 2007-193245 A | 8/2007 |
| JP | 4054687 B2 | 12/2007 |
| JP | 3139696 U | 2/2008 |
| JP | 2008-136160 | 6/2008 |
| JP | 2009-047743 A | 3/2009 |
| JP | 2010-078739 A | 4/2010 |

OTHER PUBLICATIONS

Notice of Rejection mailed by Japan Patent Office on Feb. 5, 2013 in the corresponding Japanese patent application No. 2012-129107, which is a divisional application for JP No. 2011-044427.

* cited by examiner

US 8,687,352 B2

VIDEO DISPLAY DEVICE, AND ELECTRONIC DEVICE

CROSS-REFERENCE TO RELATED APPLICATIONS

This application is based upon and claims the benefit of priority from Japanese Patent Application No. 2011-044427, filed Mar. 1, 2011, the entire contents of which are incorporated herein by reference.

FIELD

Embodiments described herein relate generally to a video display device, and an electronic device.

BACKGROUND

There has been known video display devices provided with a rotating support portion that rotatably supports a display device.

In this type of video display devices, it may be required that the rotating support portion be positioned more upward.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
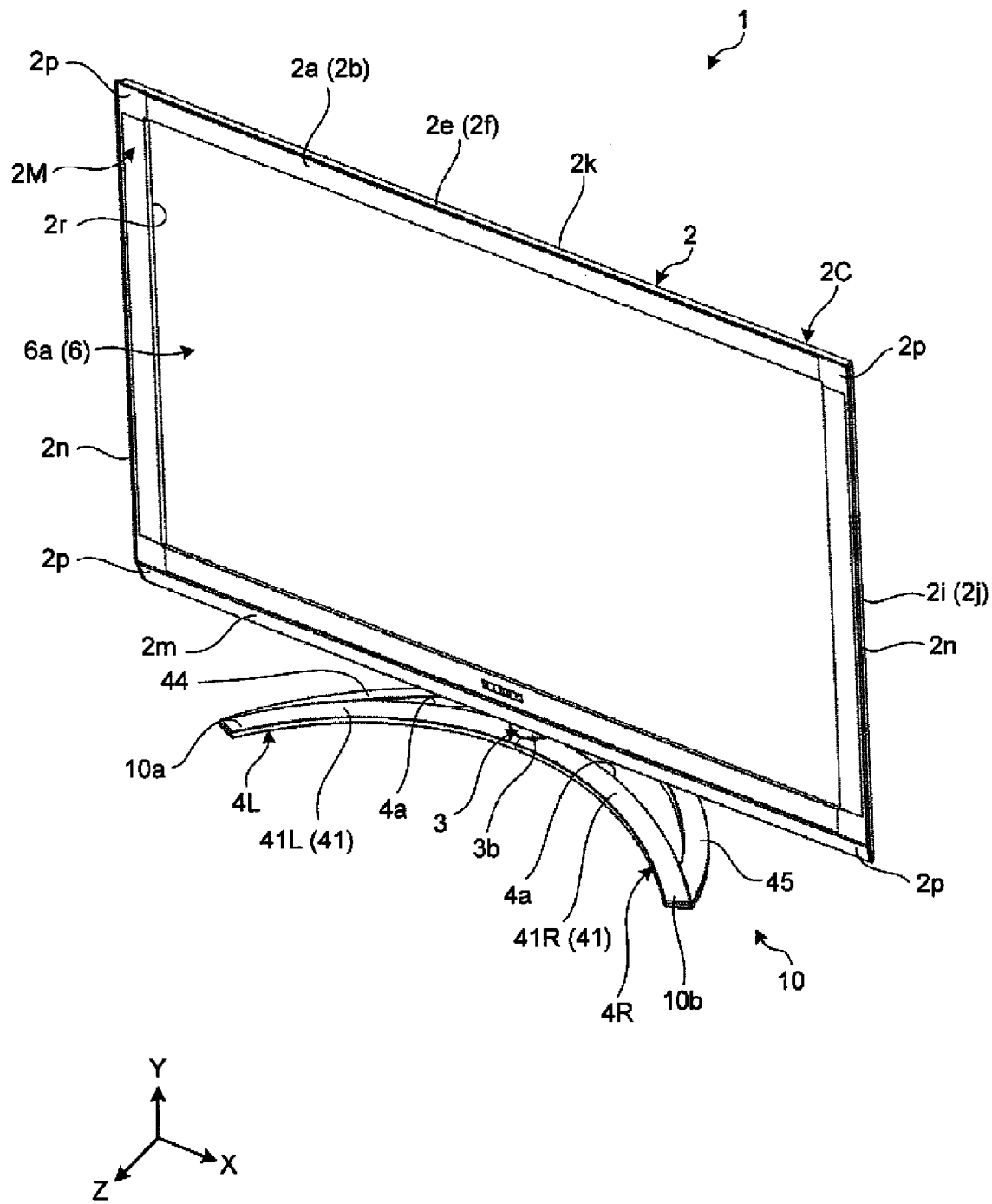
FIG. 1 is an exemplary perspective view of a video display device viewed from the front according to an embodiment.

In general, according to one embodiment, a video display device comprises a housing, a display device, a rotating support portion, and a support portion. The housing comprises a first wall provided with a first opening and a second wall located opposite the first wall. The display device is housed in the housing, and comprises a display screen located between the first wall and the second wall and exposed from the first opening. The rotating support portion is configured to rotatably support the display device. The support portion comprises a first end to be placed, a second end located opposite the first end and connected to the rotating support portion, a linking portion extending between a first position close to the first wall and a second position close to the second wall, and a second opening between the first end and the second end. The support portion is configured to support the rotating support portion to be apart from a plane where the video display device is placed.

Exemplary embodiments will be described in detail below with reference to the accompanying drawings. In the following embodiments, like elements are designated by like reference numerals, and their description will not be repeated.

Figure 5:
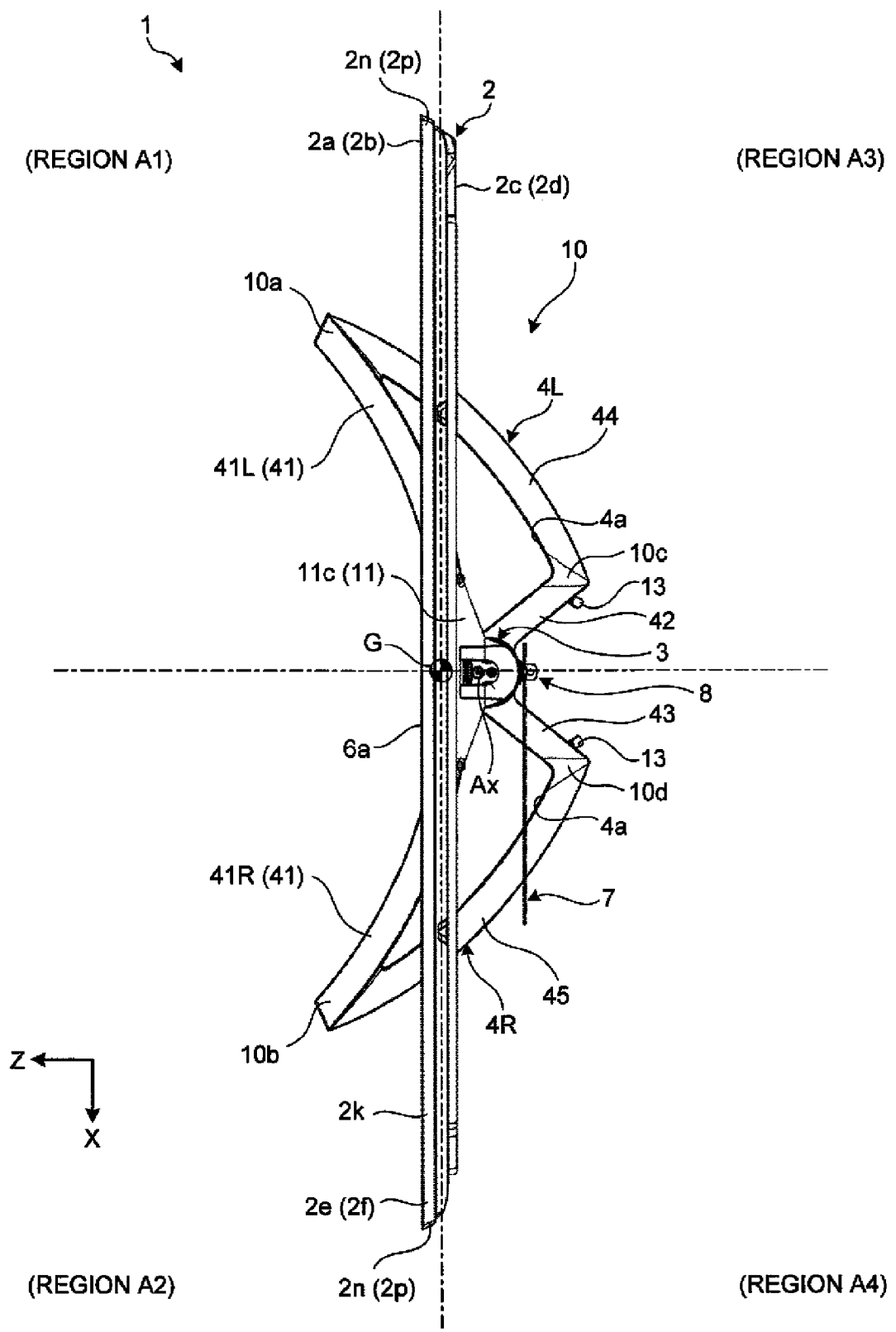
FIG. 5 is an exemplary top view of the video display device in the embodiment.
Figure 6:
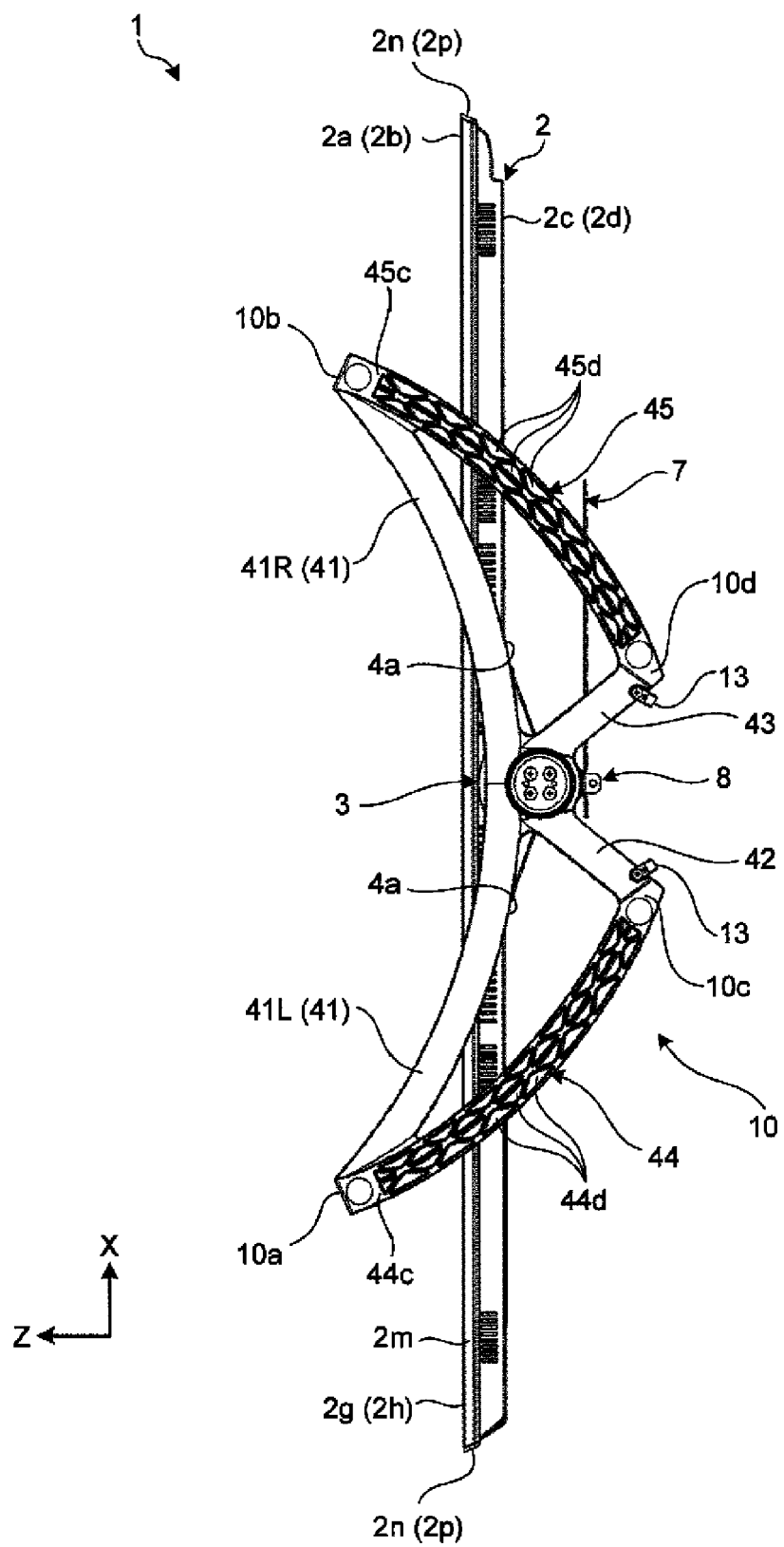
FIG. 6 is an exemplary bottom view of the video display device in the embodiment.
Figure 7:
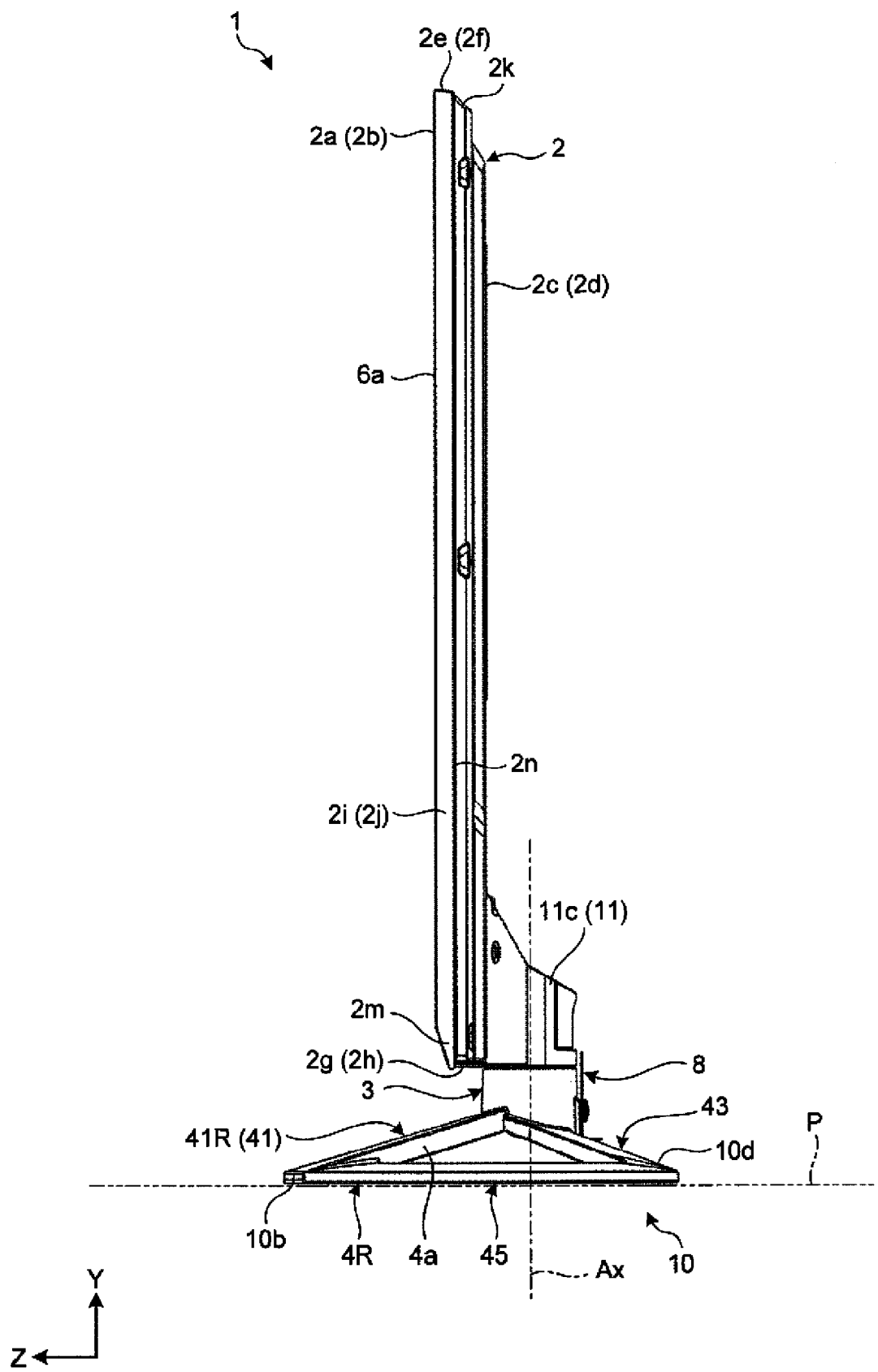
FIG. 7 is an exemplary side view of the video display device in the embodiment.

FIGS. 1 to 9 illustrate a video display device 1 as an example of an electronic device according to an embodiment. The video display device 1 comprises a housing 2 and a stand 10. For the sake of convenience, in the center of the movable range of the housing 2, directions are defined as follows: X direction indicates the right direction in the front view of the display screen of the video display device 1 (left in the back view); Y direction indicates the up direction; and Z direction indicates the normal direction (front direction) of the display screen. The housing 2 is rotatably supported by the stand 10. In the embodiment, as illustrated in FIG. 5, the housing 2 can rotate along the XZ plane within a predetermined movable range (angular range) about a rotating axis Ax (see FIGS. 5 and 7) extending along the Y direction. FIGS. 1 to 9 illustrate the state where the housing 2 is located at the middle (center) within the movable range.

The housing 2 has a rectangular appearance (a horizontally-long rectangle long in the X direction and short in the Y direction) in the front view of a front surface 2a and a display screen 6a (view in the Z direction). The housing 2 is formed in a rectangular parallelepiped shape relatively thin in the front-back direction (the Z direction). The housing 2 comprises a front wall 2b forming the front surface 2a, a back wall 2d forming a back surface 2c, a top wall (side wall on the upper side, peripheral wall) 2f forming an upper surface 2e, a bottom wall (side wall on the lower side, peripheral wall) 2h forming a lower surface 2g, and a side wall (right and left side walls, peripheral wall) 2j forming a side surface (peripheral surface) 2i.

The front wall 2b and the back wall 2d are provided in parallel to each other with a space therebetween. The front wall 2b has an opening (first opening) 2r having a rectangular shape (a horizontally-long rectangle long in the X direction and short in the Y direction). The top wall 2f, the bottom wall 2h, and the side wall 2j (peripheral walls) are provided between the front wall 2b and the back wall 2d and extend in a direction crossing (perpendicular to) the front wall 2b and the back wall 2d. The front wall 2b, the back wall 2d, the top wall 2f, and the bottom wall 2h are an example of a wall. The front wall 2b is an example of a first wall, the back wall 2d is an example of a second wall, and the bottom wall 2h is an example of a third wall.

Figure 2:
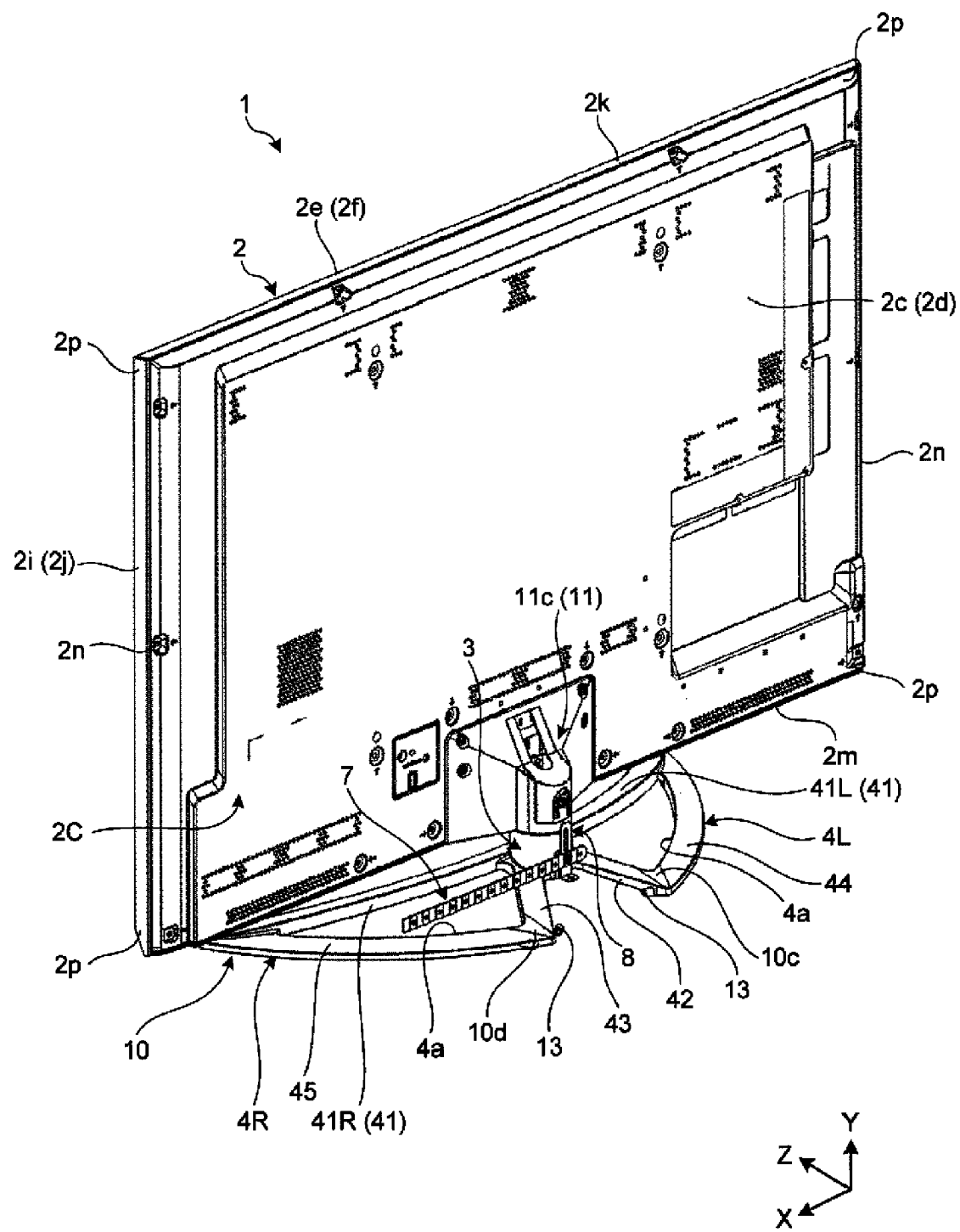
FIG. 2 is an exemplary perspective view of the video display device viewed from the back in the embodiment.

As illustrated in FIGS. 1 and 2, the housing 2 is formed of a combination of parts such as a front mask (first component) 2M on the front surface 2a side and a back cover (second component) 2C on the back surface 2c side. The housing 2 may be made of, for example, a synthetic resin material, a metallic material, or a combination thereof.

The housing 2 has an upper edge (upper side) 2k, a lower edge (lower side) 2m, and a side edge (side) 2n, and four corners 2p. The front surface 2a, the back surface 2c, the upper surface 2e, the lower surface 2g, and the side surface 2i are an example of a surface portion.

Figure 8:
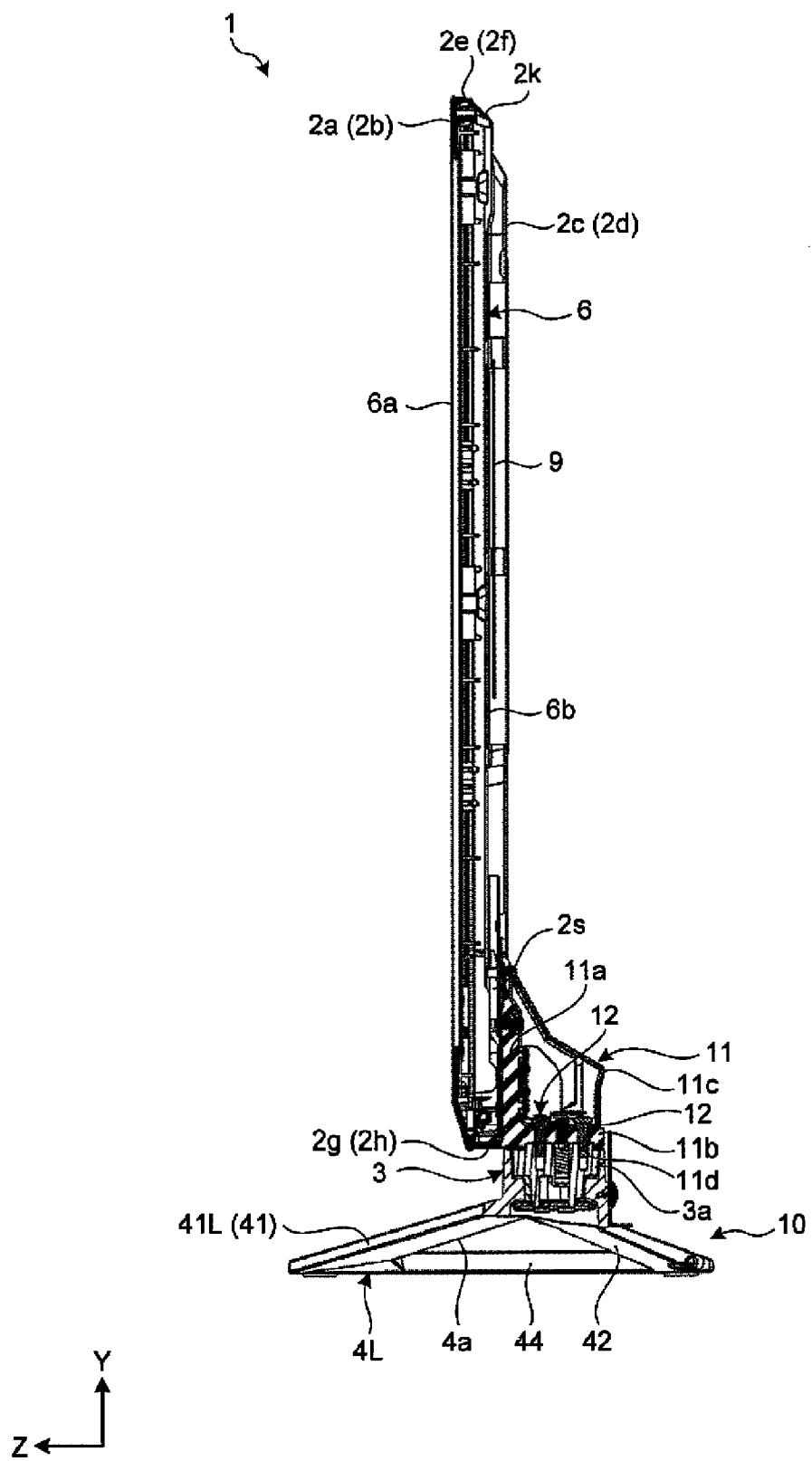
FIG. 8 is an exemplary cross-sectional view taken along a line VIII-VIII in FIG. 3 in the embodiment.

As illustrated in FIGS. 2 and 8, the housing 2 is provided with a coupling portion (protrusion, connection portion) 11 to be attached to the stand 10. For example, the coupling portion 11 is located in the horizontal center of the lower part of the back surface 2c (the back wall 2d). As illustrated in FIG. 8, the coupling portion 11 comprises, for example, a base 11a attached to a support portion 2s (frame portion, framework) in the housing 2, an attachment portion 11b projecting from the base 11a and provided with a through hole 11d, and a cover 11c covering the base 11a and the attachment portion 11b. The attachment portion 11b is attached to a movable portion 3a of a rotating support portion (movable support portion, connection portion) 3 with a fastener 12 such as a screw. After the attachment portion 11b (i.e., the housing 2, the display device 6) is connected to the movable portion (rotating portion, supported portion, engaging portion) 3a (i.e., the rotating support portion 3, the stand 10), the cover 11c is attached.

As illustrated in FIG. 8, the housing 2 houses the display device (display portion, display module, module) 6. Specifically, the display device 6 is located between the front wall 2b and the back wall 2d while surrounded by the sidewall 2j. The display device 6 has a rectangular appearance (a horizontally-long rectangle long in the X direction and short in the Y direction) in the front view. The display device 6 is formed in a rectangular parallelepiped shape relatively thin in the front-back direction (the Z direction). The display screen 6a has a rectangular appearance (a horizontally-long rectangle long in the X direction and short in the Y direction) in the front view and is provided on part of the front surface of the display device 6. The display screen 6a is exposed to the front from the opening 2r formed in the front wall 2b (the front surface 2a) of the housing 2. A back surface 6b is located opposite the display screen 6a. The display device 6 may be a panel (panel unit) such as, for example, a liquid crystal display (LCD) panel or an organic electroluminescent display (GELD) panel.

A circuit board (substrate, board portion, control board, printed circuit board) 9 is housed in the housing 2. The circuit board 9 is fixed (attached) to the back surface (rear surface) 6b of the display device 6 with a fastener (not illustrated) such as a screw. A boss (protrusion, screw portion, not illustrated) is formed on the back surface 6b, onto which the circuit board 9 is attached with a fastener such as a screw. The circuit board 9 has mounted thereon various components (not illustrated) such as electronic components to form a video processing circuit, an input signal processing circuit, a frame rate converter (FRC) circuit, a timing control (TCON) circuit, a driver circuit, a control circuit, and the like (not illustrated). On the circuit board 9 or the back surface 6b, there may be provided a storage device (storage unit, storage module, module) such as a hard disk drive (HDD) or a solid state drive (SSD), a fan unit (fan, cooling unit, cooling component), a power supply circuit (power supply, power supply unit), and the like (not illustrated).

As illustrated in FIGS. 10 to 21, the stand 10 comprises, for example, two support portions 4L and 4R, and the rotating support portion 3 supported by the support portions 4L and 4R as well as rotatably supporting the housing 2. The rotating support portion 3 is an example of a connection unit interposed between the support portions 4L and 4R and the housing 2. The stand 10 may be made of, for example, a metal material (e.g., aluminum alloy). The stand 10 may be formed by a casting (e.g., aluminum die casting) except for the movable portion 3a and the attached components.

The support portion 4L is located on the left side of the display screen 6a (see FIGS. 1 and 3) in the front view. The support portion 4L comprises a first portion 41L and a second portion 42, which extend downward from the cylindrical rotating support portion 3, and a linking portion 44 extending between the first portion 41L and the second portion 42. The first portion 41L and the second portion 42 are an example of a standing portion.

Figure 3:
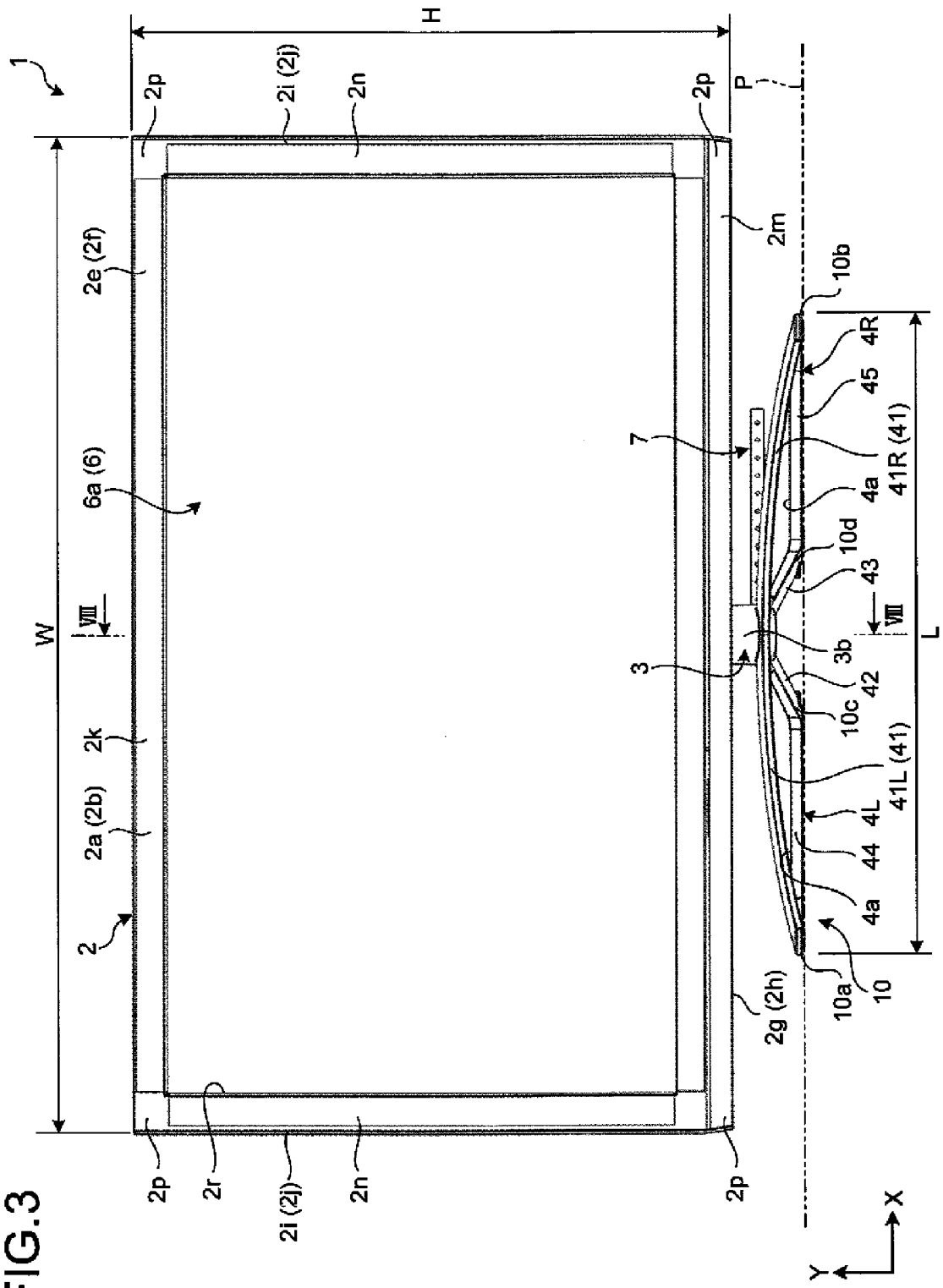
FIG. 3 is an exemplary front view of the video display device in the embodiment.
Figure 4:
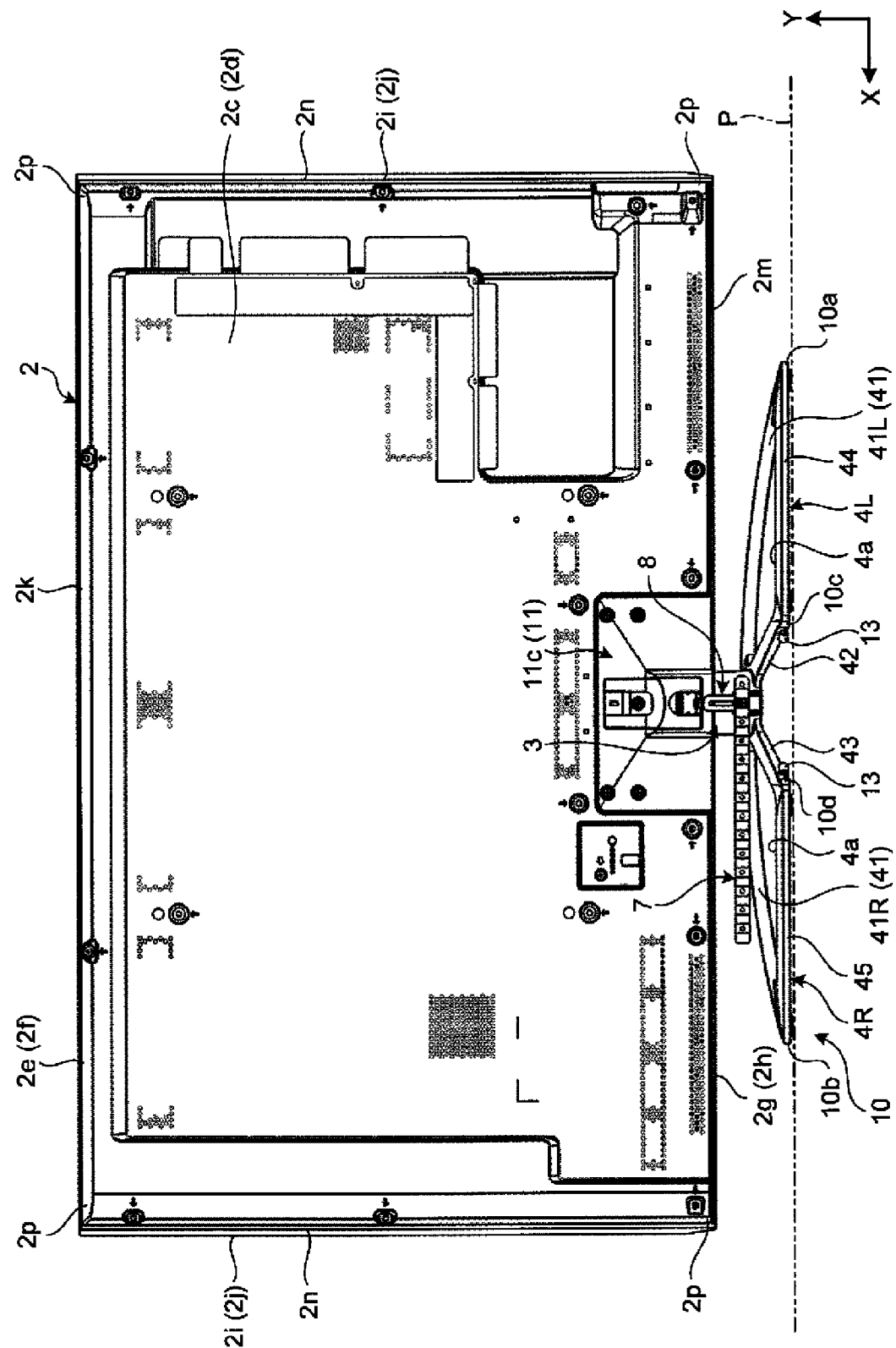
FIG. 4 is an exemplary back view of the video display device in the embodiment.
Figure 12:
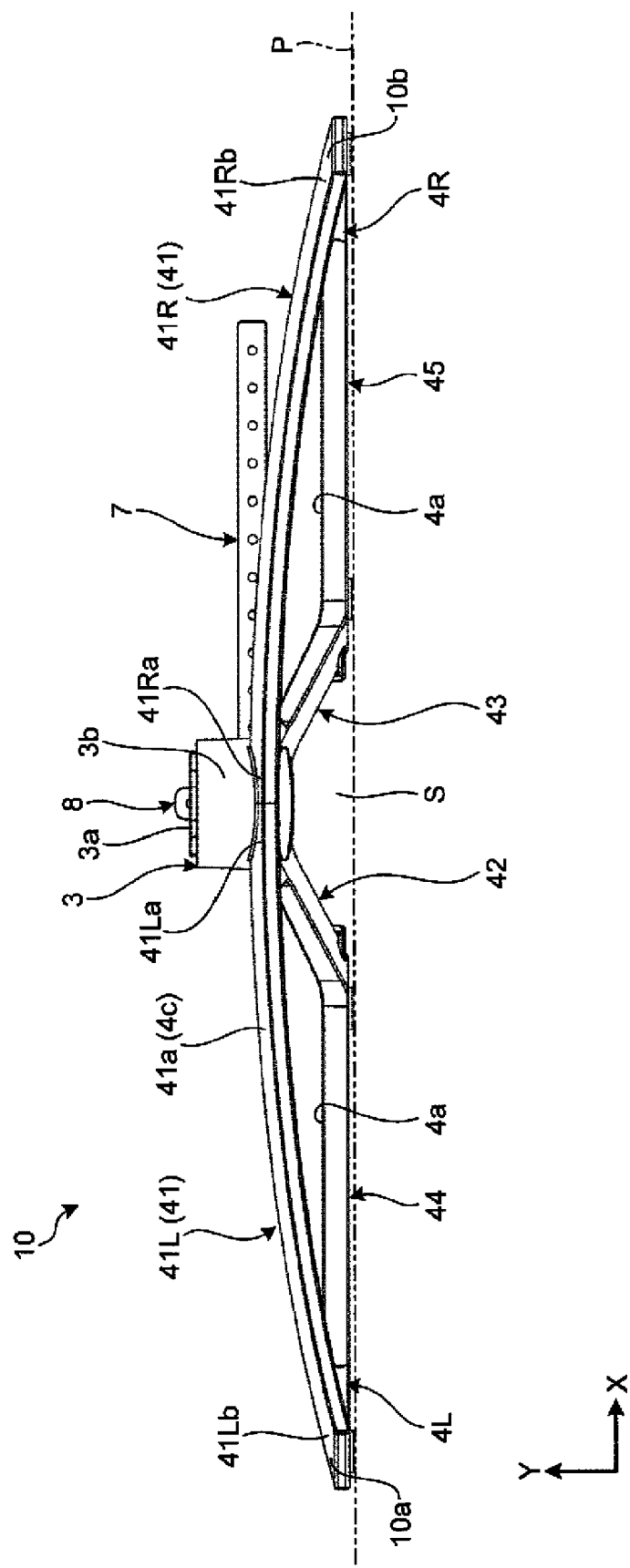
FIG. 12 is an exemplary front view of the stand in the video display device in the embodiment.

The first portion (front support portion, front portion, first leg portion) 41L has a rectangular cross-section, and extends from a base end (upper end, end) 41La, which is connected to a front end (end) 3b at the front from the center (center of gravity, rotating axis Ax) of the rotating support portion 3, toward an end (lower end) 41Lb located leftward, frontward, and downward in the front view (view of FIGS. 3 and 12). The first portion 41L is formed in an arc shape (curved). The end 41Lb is connected to an end (outer end) 44a of the linking portion 44. For example, the first portion 41L is solid.

The second portion (back support portion, back portion, second leg portion) 42 has a rectangular cross-section, and extends from a base end (upper end, second end) 42a, which is connected to a side end (end) 3c of the rotating support portion 3, toward an end (lower end, end) 42b located leftward, backward, and downward in the front view. The end 42b is connected to an end (inner end) 44b of the linking portion 44. For example, the second portion 42 is solid.

The linking portion 44 links the end 41Lb of the first portion 41L and the end 42b of the second portion 42, and extends along the lower edge of the support portion 4L between them. The linking portion 44 is formed in an arc shape (curved) between the ends 44a and 44b. Specifically, the linking portion 44 is bent in an arc. In the embodiment, as illustrated in FIGS. 10, 11, 14, and 15, the linking portion 44 is bent to project toward a direction away from the rotating support portion 3, i.e., toward a direction away from the housing 2. As illustrated in FIG. 15, a plurality of recesses 44d are formed on a back surface 44c of the linking portion 44, whereby a truss composed of triangles is formed between the ends 44a and 44b. With this truss, a structure having required rigidity and strength can be achieved with a reduced weight. Instead of the truss, a honeycomb structure composed of a series of (closely-spaced) hexagons may be used. For example, the linking portion 44 is solid.

The support portions 4L and 4R are symmetry with respect to a YZ plane C (see FIG. 14) passing through the center of the display screen 6a. That is, the support portions 4R and 4L are in a mirror-image relation.

Specifically, the support portion 4R is located on the right side of the display screen 6a in the front view. The support portion 4R comprises a first portion 41R and a second portion 43, which extend downward from the cylindrical rotating support portion 3, and a linking portion 45 extending between the first portion 41R and the second portion 43.

The first portion (front support portion, front portion, first leg portion) 41R has a rectangular cross-section, and extends from a base end (upper end, second end) 41Ra, which is connected to the front end (end) 3b at the front from the center (center of gravity, rotating axis Ax) of the rotating support portion 3, toward an end (lower end, end) 41Rb located rightward, frontward, and downward in the front view (view of FIGS. 3 and 12). The first portion 41R is formed in an arc shape (curved). The end 41Rb is connected to an end (outer end) 45a of the linking portion 45. For example, the first portion 41R is solid.

The second portion (back support portion, back portion, second leg portion) 43 has a rectangular cross-section, and extends from a base end (upper end, second end) 43a, which is connected to the side end (end) 3c of the rotating support portion 3, toward an end (lower end, end) 43b located rightward, backward, and downward in the front view. The end 43b is connected to an end (inner end) 45b of the linking portion 45. For example, the second portion 43 is solid.

The linking portion 45 links the end 41Rb of the first portion 41R and the end 43b of the second portion 43, and extends along the lower edge of the support portion 4R between them. The linking portion 45 is formed in an arc shape (curved) between the ends 45a and 45b. Specifically, the linking portion 45 is bent in an arc. In the embodiment, as illustrated in FIGS. 10, 11, 14, and 15, the linking portion 45 is bent to project toward a direction away from the rotating support portion 3, i.e., toward a direction away from the housing 2. A plurality of recesses 45d are formed on a back surface 45c of the linking portion 45, whereby a truss composed of triangles is formed between the ends 45a and 45b. With this truss, a structure having required rigidity and strength can be achieved with a reduced weight. Instead of the truss, a honeycomb structure composed of a series of (closely-spaced) hexagons may be used. For example, the linking portion 45 is solid.

Figure 10:
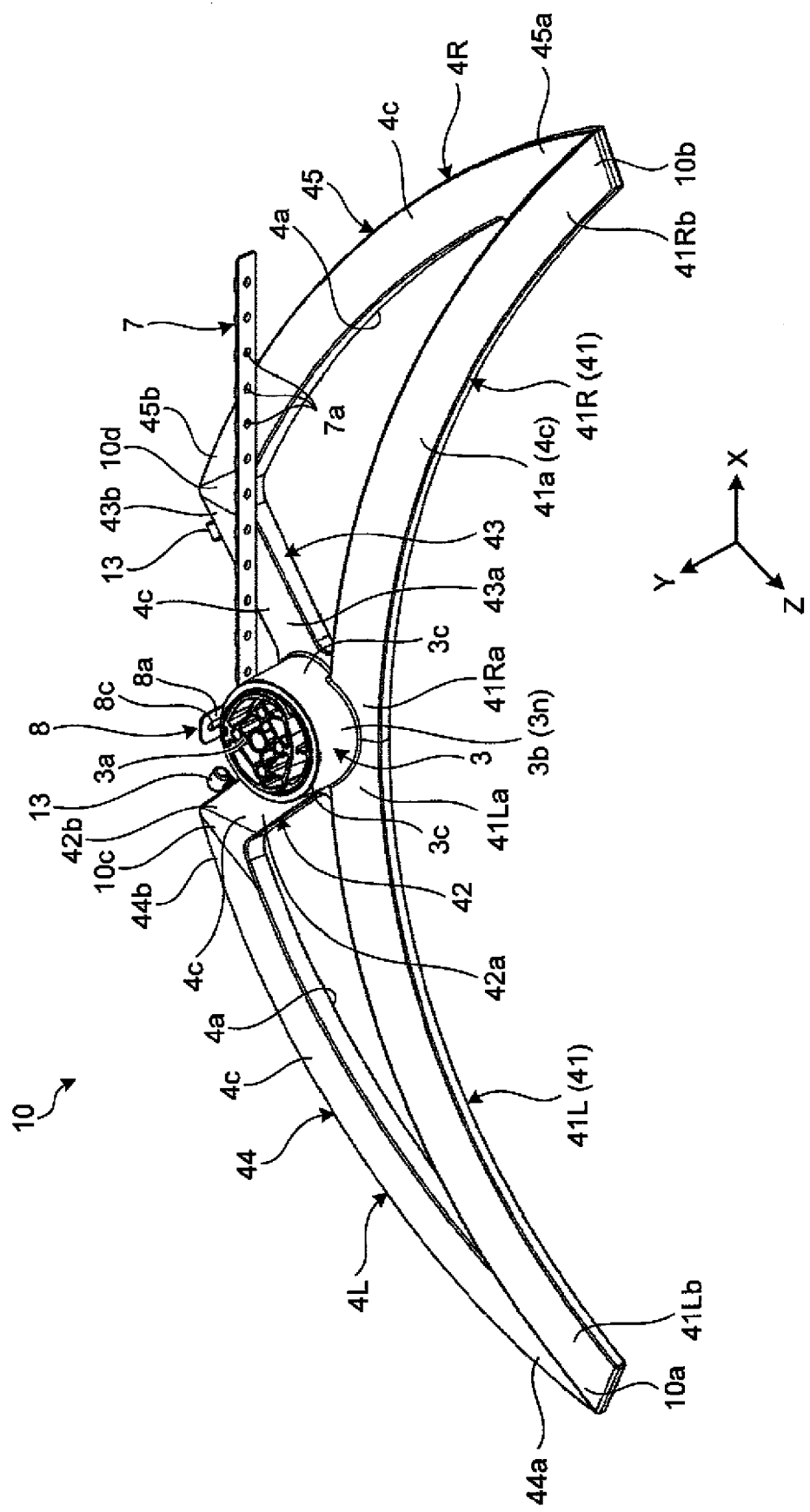
FIG. 10 is an exemplary perspective view of a stand in the video display device viewed from the front in the embodiment.
Figure 11:
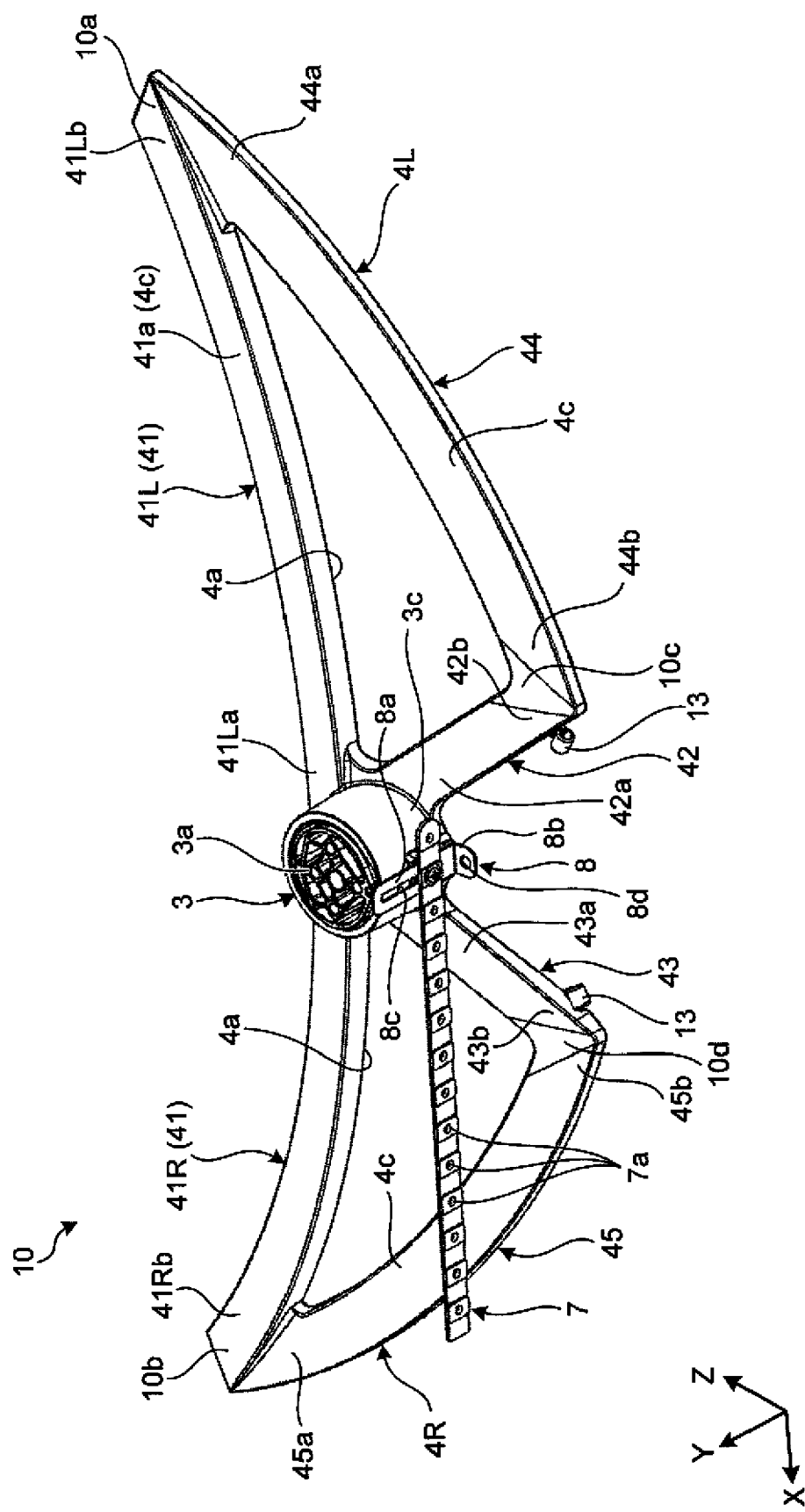
FIG. 11 is an exemplary perspective view of the stand in the video display device viewed from the back in the embodiment.
Figure 14:
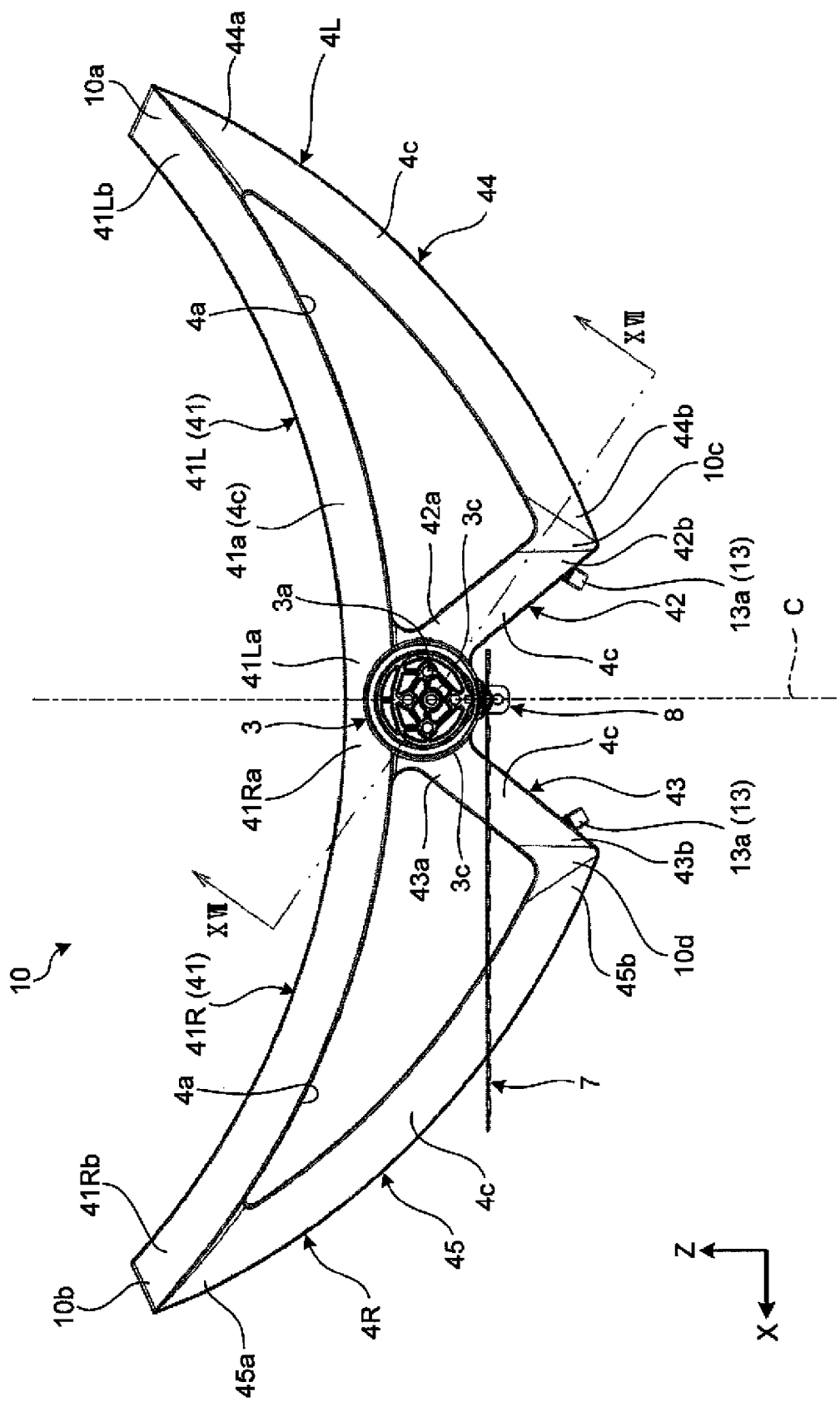
FIG. 14 is an exemplary top view of the stand in the video display device in the embodiment.
Figure 15:
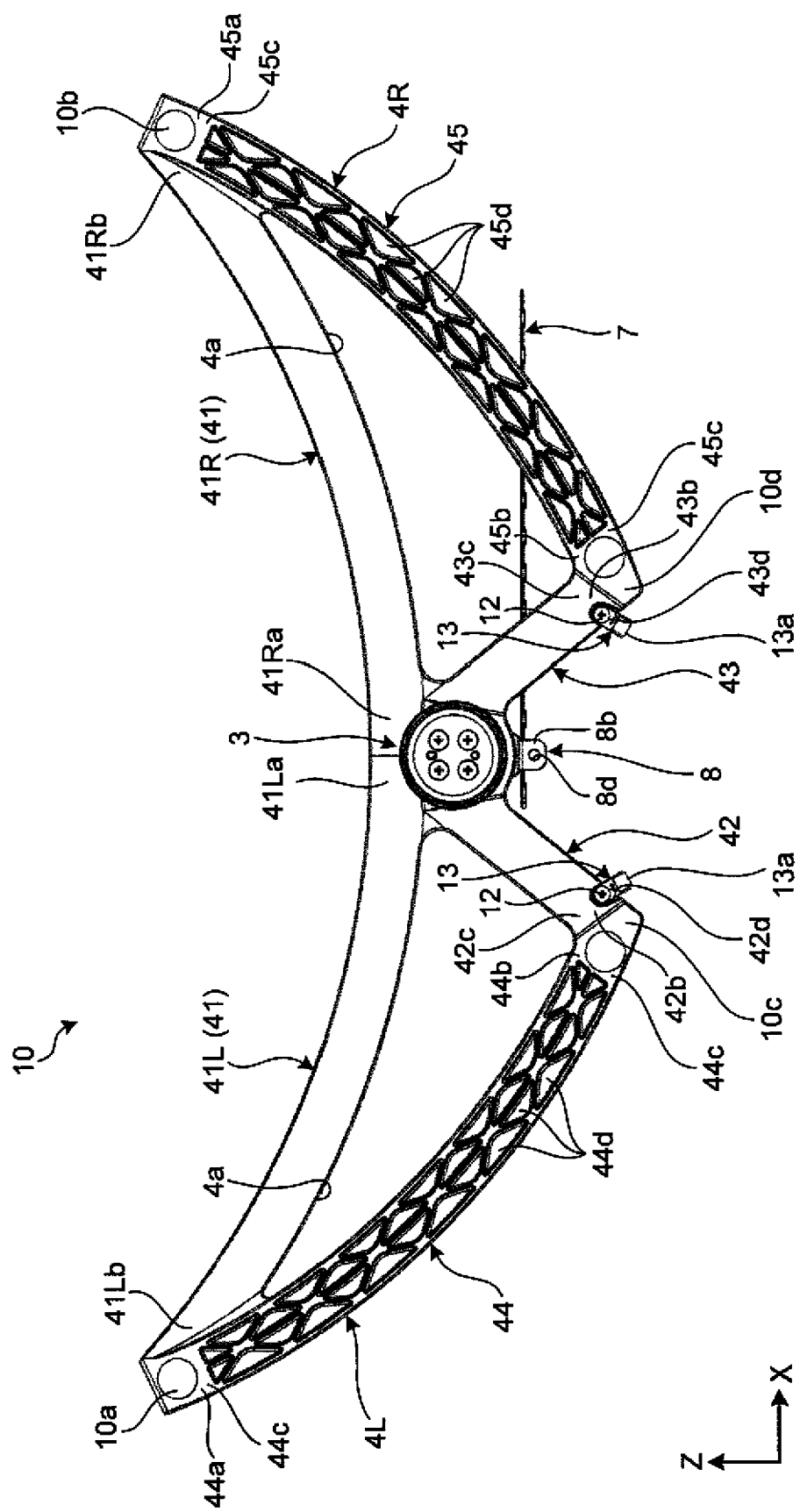
FIG. 15 is an exemplary bottom view of the stand in the video display device in the embodiment.

As illustrated in FIGS. 10, 14, and 15, in the embodiment, the first portion 41L of the support portion 4L and the first portion 41R of the support portion 4R are smoothly connected (brought into contact) to each other at a connection portion (i.e., the base ends 41La and 41Ra) to the front end 3b of the rotating support portion 3. For example, the tangent line at the base end 41La of the first portion 41L and the tangent line at the base end 41Ra of the first portion 41R are the same. In the embodiment, for example, the radius of curvature of the first portion 41L and the radius of curvature of the first portion 41R are equal to each other. That is, in the embodiment, the first portion 41L and the first portion 41R form a series of an arc leg portion (front leg portion, first leg portion, foot portion, arm portion, standing portion, edge portion, edge) 41.

Figure 16:
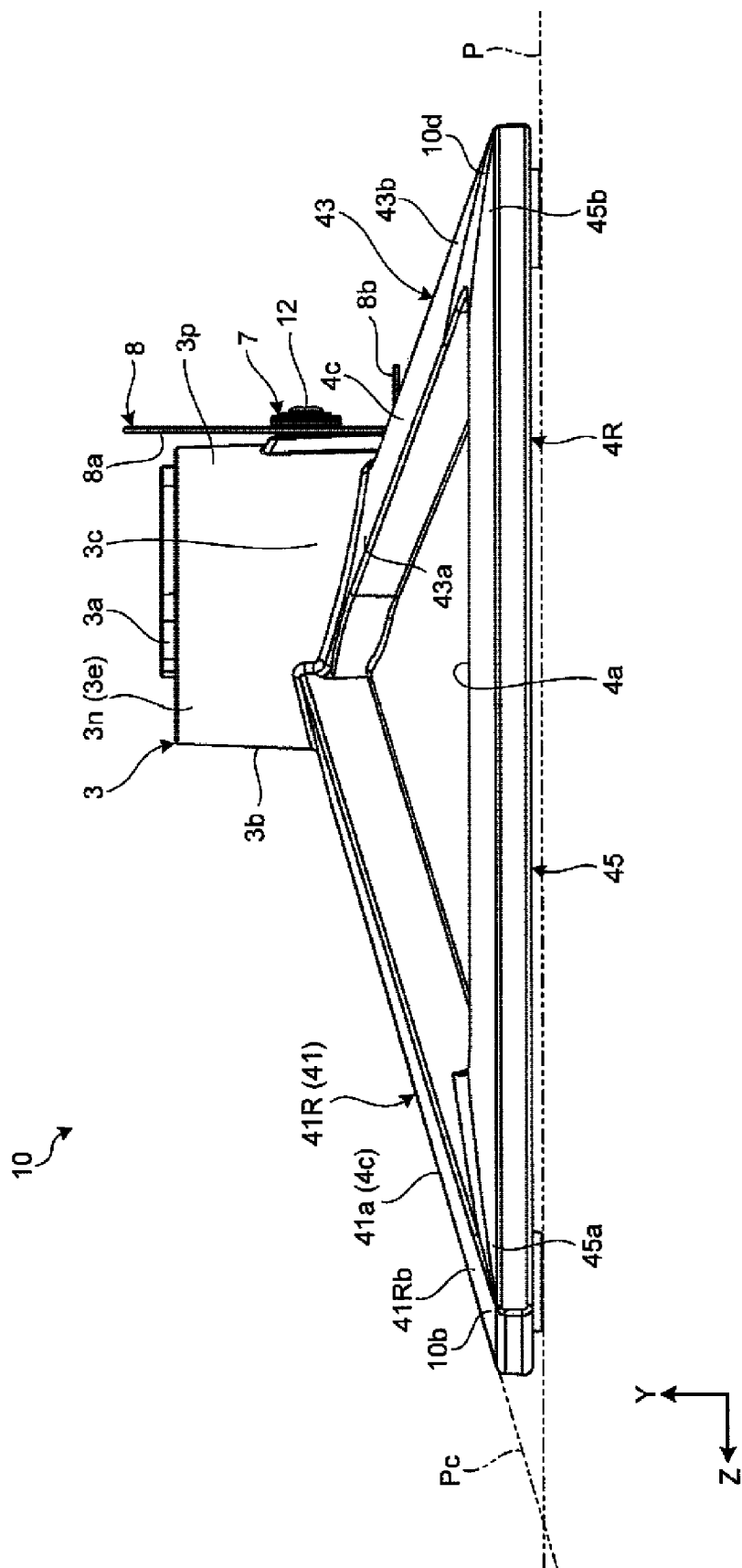
FIG. 16 is an exemplary side view of the stand in the video display device in the embodiment.

As illustrated in FIG. 12, the leg portion 41 stands from a plane P like an arch. Specifically, the leg portion 41 is curved upward in an arc shape, wherein the ends 41Lb and 41Rb serve as lower ends and side ends, while the base ends 41La and 41Ra serve as upper ends and center portions. In other words, as illustrated in FIG. 16, the leg portion 41 extends along a plane Pc corresponding to the XY plane tilted at a predetermined angle to the X axis (the XY plane rotated counterclockwise in FIG. 16). In the embodiment, an upper surface 41a of the leg portion 41 (the first portions 41L and 41R) is along the plane Pc.

In the stand 10 having the support portions 4L and 4R configured as above, at least four ends (first ends) 10a, 10b, 10c, and 10d become placing points (contact points, support points, placing portion, placing part, placing surface, surface) with the plane P (placing surface). As illustrated in FIG. 5, the end 10a as a placing point is arranged in a region (upper-left region in FIG. 5, first position) A1 that is the left frontal region, in the front view, with respect to the housing 2 (with respect to the center of gravity G of the housing 2). On the other hand, the end 10b as a placing point is arranged in a region (lower-left region in FIG. 5, first position) A2 that is the right frontal region, in the front view, with respect to the housing 2 (with respect to the center of gravity G of the housing 2). The end 10c as a placing point is arranged in a region (upper-right region in FIG. 5, second position) A3 that is the left back region, in the front view, with respect to the housing 2 (with respect to the center of gravity G of the housing 2). The end 10d as a placing point is arranged in a region (lower-right region in FIG. 5, second position) A4 that is the right back region, in the front view, with respect to the housing 2 (with respect to the center of gravity G of the housing 2). With this, the stand 10 can more stably support the video display device 1 including the housing 2 in front, back, left, and right directions. In the embodiment, the base ends (second ends) 41La, 41Ra, 42a, and 43a of the first portions 41L and 41R and the second portions 42 and 43 connected to the rotating support portion 3 are an example of the second end.

In the embodiment, as illustrated in FIGS. 14 and 15, the linking portions 44 and 45 are bent to project (protrude) toward a direction away from the housing 2 (from the center of gravity of the housing 2). Accordingly, the stand 10 can more stably support the video display device 1 including the housing 2 in the direction in which the linking portions 44 and 45 protrude, compared to the case without the bent portion.

Figure 17:
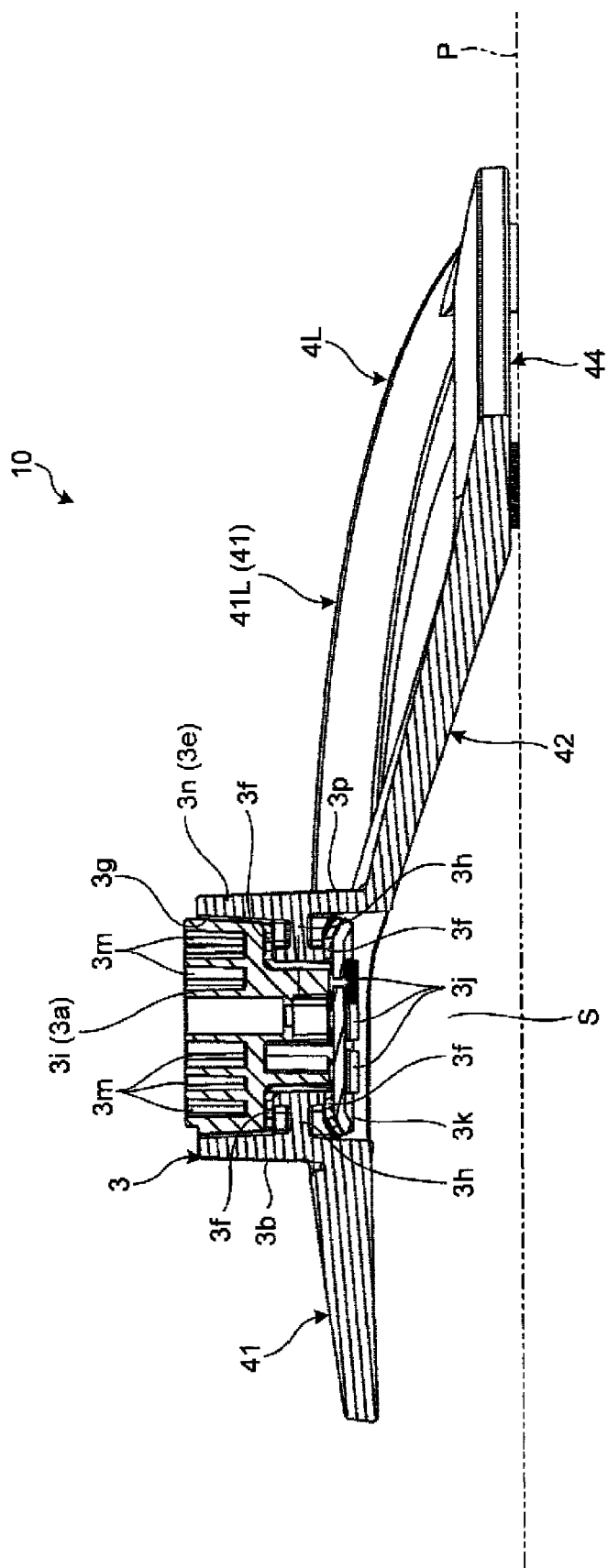
FIG. 17 is an exemplary cross-sectional view taken along a line XVII-XVII in FIG. 14 in the embodiment.

As illustrated in FIGS. 12 and 17, the support portion 4L comprises the linking portion 44 extending between the first position A1 and the second position A3, and the first portion 41L and the second portion 42 as standing portions provided with an opening (second opening) 4a surrounded by the first portion 41L and the second portion 42 (and the upper part of the linking portion 44). When the video display device 1 is placed on the plane P, the support portion 4L supports the rotating support portion 3 to be apart from the plane P (to be separated from the plane P with a clearance, a gap, or a space, to be floated). The opening 4a faces the housing 2 (the bottom wall 2h of the housing 2).

The support portion 4R comprises the linking portion 45 extending between the first position A2 and the second position A4, and the first portion 41R and the second portion 43 as standing portions provided with the opening (second opening) 4a surrounded by the first portion 41R and the second portion 43 (and the upper part of the linking portion 45). When the video display device 1 is placed on the plane P, the support portion 4R supports the rotating support portion 3 to be apart from the plane P (to be separated from the plane P with a clearance, a gap, or a space, to be floated).

Accordingly, in the embodiment, the support portions 4L and 4R provide a space (gap) between the rotating support portion 3 and the plane P (below the rotating support portion 3).

Figure 18:
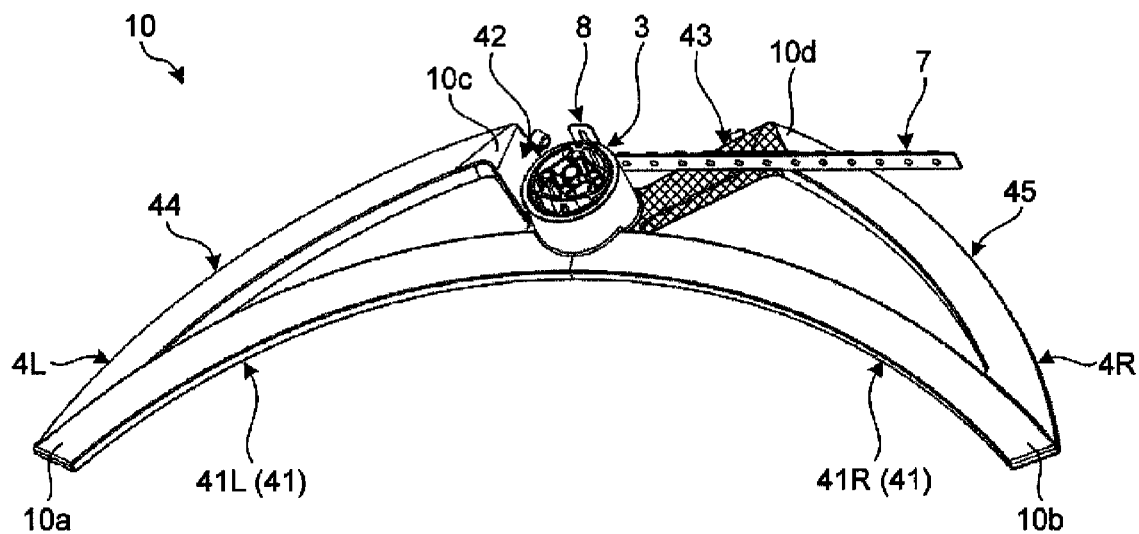
FIGS. 18 and 19 are exemplary perspective views of the stand in the video display device viewed from the front for explaining a support portion having a first portion and a second portion that is effective even if one of the portions does not function in the embodiment.
Figure 19:
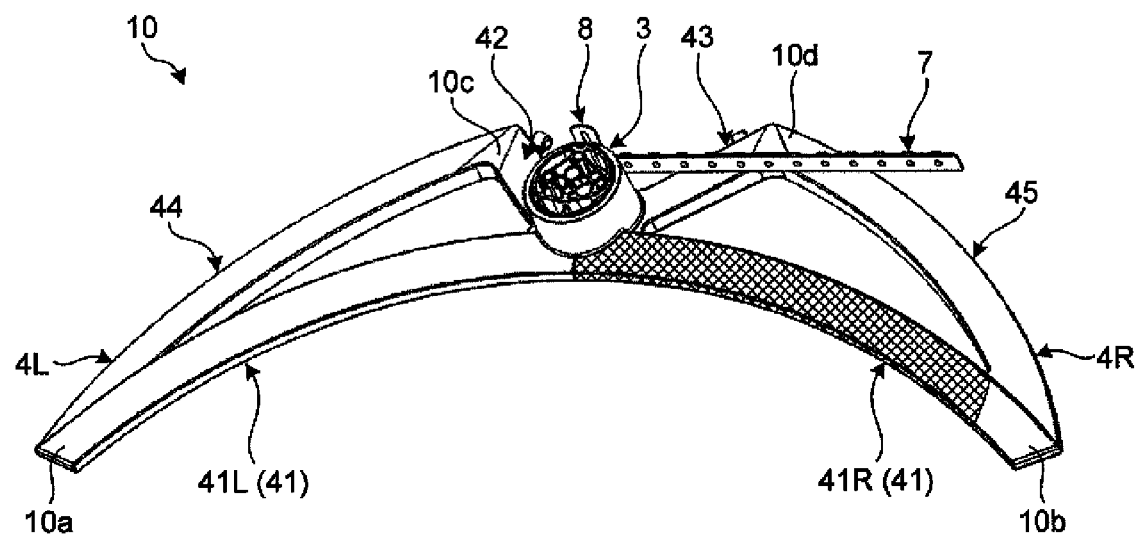

As illustrated in FIG. 18, even if the second portion 43 (hatched region) becomes nonfunctional in the stand 10 of the embodiment, the end 10d as a placing point is connected to the rotating support portion 3 through the first portion 41R and the linking portion 45. As illustrated in FIG. 19, even if the first portion 41R (hatched region) becomes nonfunctional, the end 10b as a placing point is connected to the rotating support portion 3 through the second portion 43 and the linking portion 45. FIGS. 18 and 19 illustrate the case where the first portion 41R or the second portion 43 on the right side in the front view becomes nonfunctional, but the same is applied to the case where the first portion 41L or the second portion 42 on the left side in the front view becomes nonfunctional.

Figure 20:
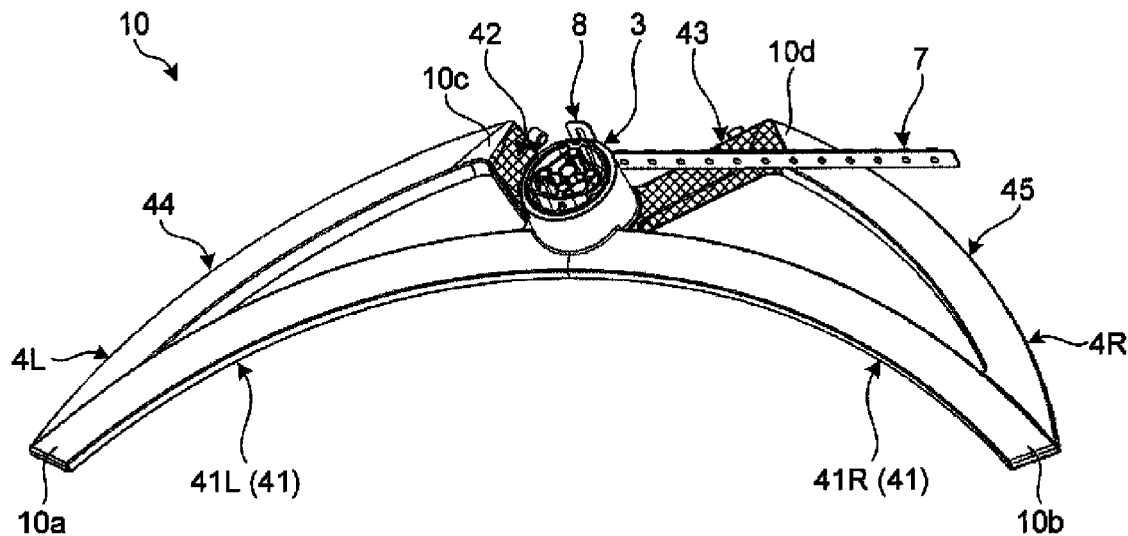
FIG. 20 is an exemplary perspective view of the stand in the video display device viewed from the front for explaining the support portion that is effective even if two of the portions on the back side do not function in the embodiment.
Figure 21:
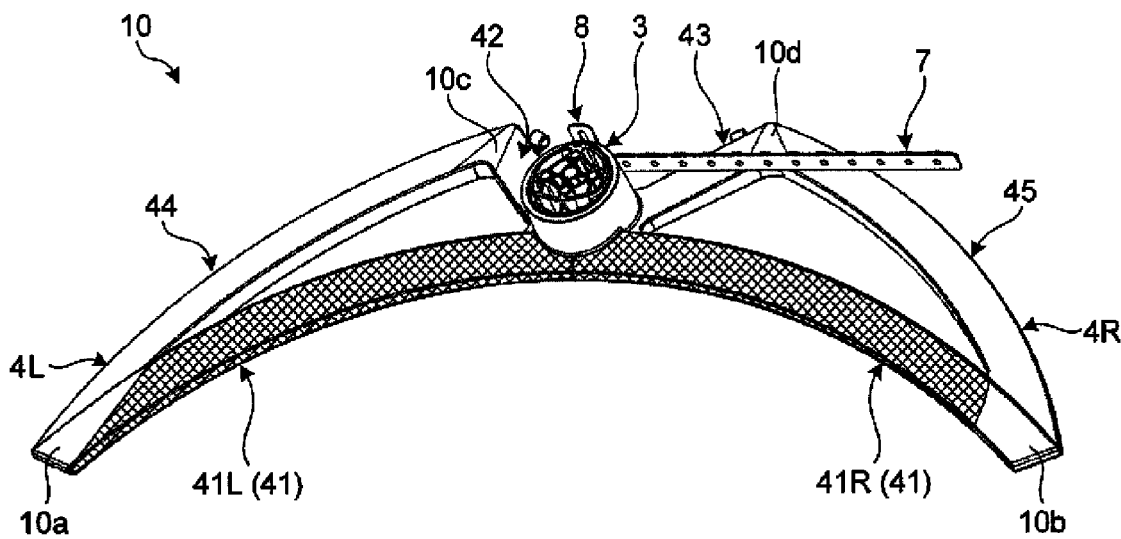
FIG. 21 is an exemplary perspective view of the stand in the video display device viewed from the front for explaining the support portion that is effective even if two of the portions on the front side do not function in the embodiment.

As illustrated in FIG. 20, even if both the second portions 42 and 43 (hatched regions) become nonfunctional in the stand 10 of the embodiment, the ends 10c and 10d as placing points are connected to the rotating support portion 3 through the linking portions 44 and 45 and the first portions 41L and 41R. As illustrated in FIG. 21, even if both the first portions 41L and 41R (hatched regions) become nonfunctional, the ends 10c and 10d as placing points are connected to the rotating support portion 3 through the second portions 42 and 43 and the linking portions 44 and 45.

As described above, in the stand 10 of the embodiment, even if either one of the first portions 41L and 41R or either one of the second portions 42 and 43 becomes nonfunctional, or both the first portions 41L and 41R or both the second portions 42 and 43 become nonfunctional, the placing point does not change from the state without the nonfunctional portion as long as the required rigidity is secured at connection portions between the first portions 41L and 41R, the second portions 42 and 43, and the linking portions 44 and 45. Thus, according to the embodiment, the stand 10 can more stably support the housing 2, i.e., the video display device 1.

According to the embodiment, the opening 4a is provided to the support portions 4L and 4R, which facilitates to carry the stand 10 during transportation. Besides, the weight of the stand 10 can be reduced compared to the case without the opening 4a. Moreover, the area of an upper surface 4c of the stand 10 can be reduced, which suppresses the reflection of light from the upper surface 4c. Furthermore, the amount of refuses (dust, dirt, etc.) stacked (accumulated) on the stand 10 can be reduced.

In the embodiment, as illustrated in FIGS. 3 and 12, the rotating support portion 3 as a connection portion is not placed on the plane P by the stand 10, and there is a space (region) S below the rotating support portion 3. That is, the rotating support portion 3 is supported as being apart from the plane P. Accordingly, compared to the case where the rotating support portion 3 is located more downward, the mass of the movable portion, including the housing 2, supported by the rotating support portion 3 and a moment arm from a support point by the rotating support portion 3 can be reduced. Thus, the movable portion is less likely to shake. The space S can be used as a place where a product or a component such as a remote controller, a compact disc (CD), and a digital versatile disk (DVD) is placed. Besides, the space S facilitates to clean the space S and the surrounding area, and the backside of the housing 2.

Figure 9:
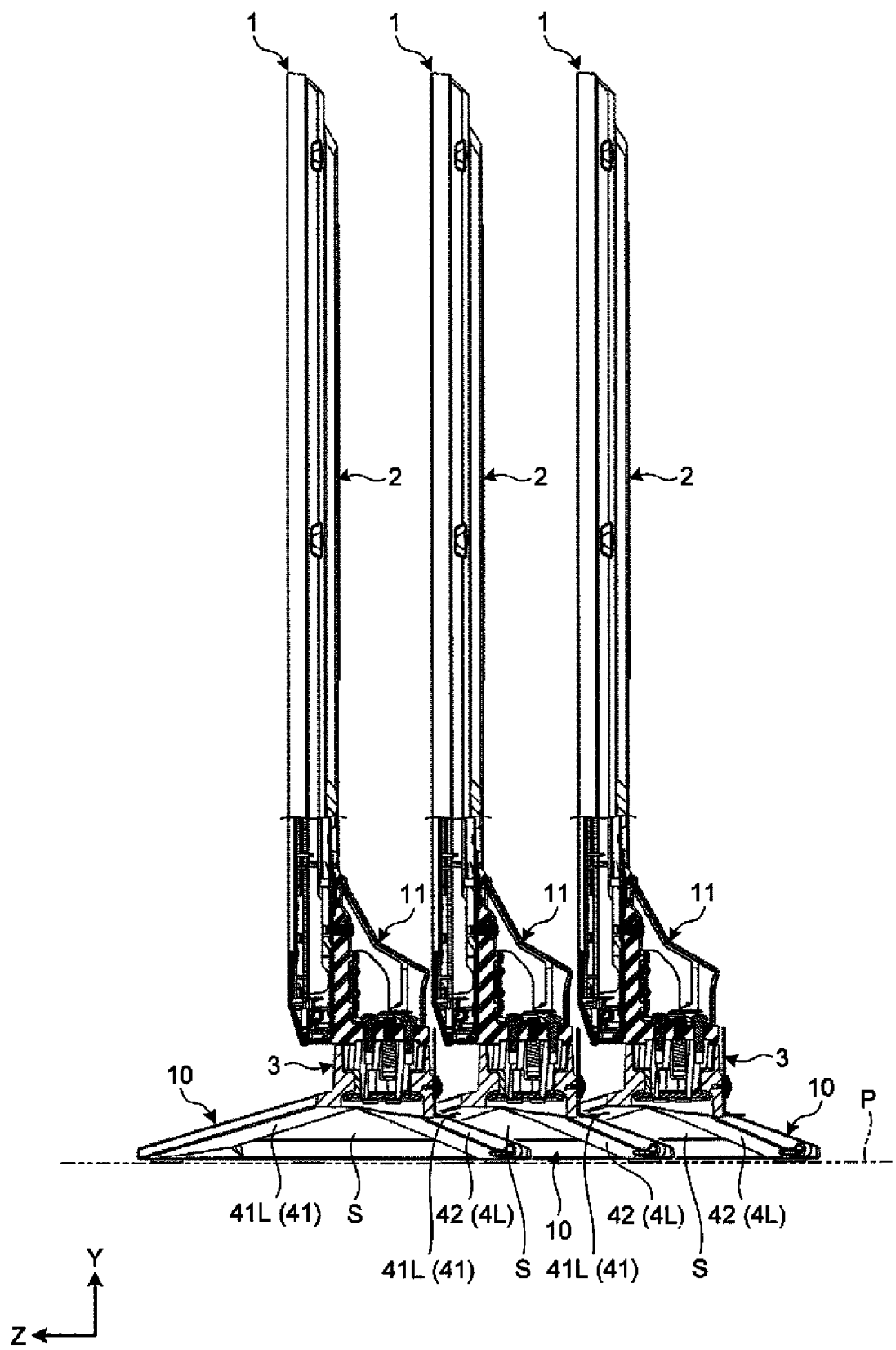
FIG. 9 is an exemplary view illustrating a plurality of video display devices aligned in the front back direction in the embodiment.

As illustrated in FIG. 9, the space S that is open to the front is formed with the front side of the leg portion (front leg portion, first leg portion, foot portion, arm portion, standing portion, edge portion, edge) 41 of the support portions 4L and 4R as an opening edge. Accordingly, the back part of the stand 10 of another video display device (1) can be inserted into the space S. Thus, the plurality of video display devices (1) can be more closely aligned in the front-back direction.

As illustrated in FIG. 3, preferably, the length L of the stand 10 is equal to or smaller than the width W or the height H of the housing 2. In the embodiment, the length L is smaller than the width W and the height H. With this, not only the housing 2 but also the stand 10 can easily be housed in a box that houses (packs) the video display device 1 for transportation.

As illustrated in FIG. 17, the rotating support portion 3 as a connection portion comprises a movable portion (rotating portion, coupling portion, engaging portion, cylindrical portion) 3a, a fixing portion (support portion, cylindrical portion) 3e, and a sliding member (smoothing member) 3f. The fixing portion 3e is provided with a cylindrical housing (receiving portion) 3g extending in the vertical direction to house the movable portion 3a. In the housing 3g, there is provided a protrusion 3h protruding inward from the peripheral surface at the center in the vertical direction. The movable portion 3a comprises an upper first member (upper member, member, divisional member) 3i, and a lower second member (lower member, member, divisional member) 3k connected and fixed to the first member 3i with a fixing member 3j such as a screw or a hexagon head bolt. The sliding member 3f is located on the upper side, inner peripheral side, and the lower side of the protrusion 3h, and is interposed between the protrusion 3h and the movable portion 3a (the first member 3i or the second member 3k). The sliding member 3f is made of a synthetic resin material having a relatively low friction coefficient. A recess (opening) such as a hole or a groove can be formed on the outer surface (sliding surface) of the sliding member 3f. In this case, the recess functions as a retaining portion of a lubricant such as grease. The fixing portion 3e of the rotating support portion 3 is integrated with the stand 10. A mounting hole 3m, such as a female screw hole, to which the fastener 12 passing through the through hole 11d (see FIG. 8) on the attachment portion 11b of the coupling portion 11 is fastened, is formed in the upper surface (coupling surface, connection surface) of the movable portion 3a. The movable portion 3a rotates about the rotating axis Ax as the central axis of the rotating support portion 3 within a predetermined angular range. The fixing member 3j is exposed to the space S, thereby the fixing member 3j can be attached or removed (for maintenance) from the space S.

As illustrated in FIGS. 14, 15, and 17, the two first portions 41L and 41R are connected at the front of the front end 3b of the rotating support portion 3 as protruding toward the side (front) from the rotating support portion 3. With this, the connection portion between a peripheral wall 3n of the fixing portion 3e of the rotating support portion 3 and the leg portion 41 (the first portions 41L and 41R, the support portions 4L and 4R) can be widened (can be made long). Thus, the stress at the connection portion between the rotating support portion 3 and the leg portion 41 (the support portions 4L and 4R) can be reduced.

Figure 13:
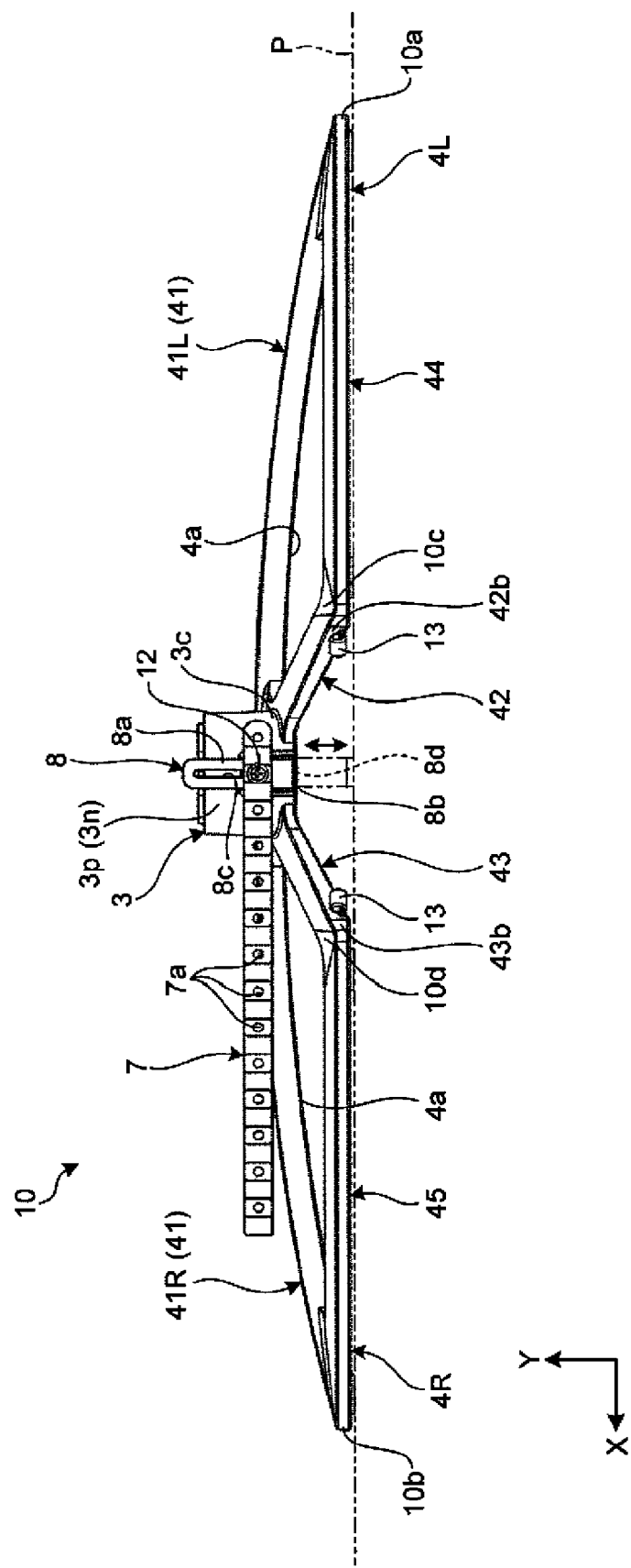
FIG. 13 is an exemplary back view of the stand in the video display device in the embodiment.

As illustrated in FIG. 13, in the embodiment, fixing members (fastening members) 7 and 8 to fix the video display device 1 are attached (fixed) to a back portion 3p of the peripheral wall 3n of the rotating support portion 3 with the fastener 12 such as a single screw. That is, the fastener 12 is used to attach (fix) the two fixing members 7 and 8. The fixing member 7 is a band made of, for example, a synthetic resin material. The fixing member 7 is formed in a band having a constant width, and is provided with a plurality of through holes 7a that may allow a fixing member (not illustrated) such as a screw or a banding band to pass therethrough along the longitudinal direction. The through holes 7a are arranged at substantially regular intervals. The fixing member 8 comprises abase 8a that is long in the vertical direction along the peripheral wall 3n, and a protrusion (standing portion, coupling portion, attachment portion) 8b protruding from the end (end, lower end) of the base 8a. The base 8a is provided with an elongated opening (slit, guide) 8c to allow the fastener 12 to pass therethrough. The protrusion 8b is provided with a through hole 8d that may allow a fixing member (not illustrated) such as a screw or a banding band to passes therethrough. By loosening the fastener 12, the fixing member 8 moves downward, whereby the protrusion 8b can be brought into contact with the installment surface (installment portion, not illustrated). The height of the installment surface with respect to the fixing member 8 may vary depending on the installment place. Regarding this, the fixing member 8 is movably provided to the stand 10, and thereby the fixing member 8 can be more reliably fixed to the installment surface. When not in use, at least part of the fixing member 8 (in the embodiment, the entire fixing member 8) is pulled up, and the fixing member 8 is fixed to the rotating support portion 3 with the fastener 12. Thus, the fixing member 8 can be hidden behind the rotating support portion 3 in the front view.

As illustrated in FIGS. 13 to 15, notch-like recesses 42d and 43d are formed in lower surfaces (back surfaces) 42c and 43c of the ends 42b and 43b of the second portions 42 and 43 as standing portions. A wire rod passing member (wire rod fastening member, annular member) 13 is attached to the recesses 42d and 43d with the fastener 12 such as a screw. At the end of the wire rod passing member 13, there is provided an annular portion (ring portion, winding portion) 13a that may allow a wire rod such as a wire or a band to pass therethrough. The video display device 1 can be fixed by using the wire rod inserted through the annular portion 13a. The portion where the recesses 42d and 43d are formed can be used as a fragile portion (easy-to-deform portion) that becomes a starting point of bend, deformation, or breakage when an excessive external force (load) is applied.

In the embodiment described above, when the video display device 1 is placed on the plane P, the rotating support portion 3 can be supported by the support portions 4L and 4R having the opening 4a to be separated from the plane P. Accordingly, when the rotating support portion 3 is located on an upper side, at least one of effects including reduction in weight, easiness in carrying the device, and suppression of reflection phenomenon can be achieved by the opening 4a provided to the support portions 4L and 4R.

In the embodiment, the linking portions 44 and 45 are provided along the lower edge of the support portions 4L and 4R. With this, the video display device 1 including the housing 2 can be supported more stably compared to the case where the linking portions 44 and 45 are not provided on the lower edge.

In the embodiment, the linking portions 44 and 45 are bent. With this, the video display device 1 including the housing 2 can be supported more stably compared to the case where the linking portions 44 and 45 are not bent.

In the embodiment, the linking portions 44 and 45 have a portion that is bent to project toward a direction away from the rotating support portion 3. In the state where required rigidity is secured, the more the support portions 4L and 4R are distant from the housing 2 (the center of gravity of the housing 2), the more stable supporting condition can be attained. In the embodiment, the linking portions 44 and 45 have a portion that is bent to project toward a direction away from the rotating support portion 3. Thus, the video display device 1 including the housing 2 can be supported more stably.

In the embodiment, the first portions 41L and 41R and the second portions 42 and 43 are provided with the opening 4a therebetween. One of the first portions 41L and 41R and one of the second portions 42 and 43 have a portion located on the left side or the right side with respect to the other in the front view of the display screen 6a. Specifically, the first portions 41L and 41R, and the second portions 42 and 43, are arranged as being shifted in the horizontal direction in the front view. Thus, the video display device 1 including the housing 2 can be supported more stably in the horizontal direction.

In the embodiment, the plurality of support portions 4L and 4R are provided. Accordingly, the video display device 1 including the housing 2 can be supported more stably compared to the case where a single support portion is provided.

In the embodiment, one of the plurality of support portions 4L and 4R is located on the left side or the right side with respect to the other one in the front view of the display screen 6a. Thus, the video display device 1 including the housing 2 can be supported more stably by the plurality of support portions 4L and 4R, which are arranged as being shifted in the horizontal direction.

FIGS. 22 to 30 illustrate plan views of stands 10A to 10I according to modifications of the embodiment. In FIGS. 22 to 30, placing points and regions at substantially the same level as the placing points are indicated by a dot pattern for the sake of convenience. In respective structures, the support portion, the first portion, and the second portion extend obliquely upward or upward toward the base end (end) connected to the rotating support portion 3 from the region indicated by a dot pattern. The stands 10A to 10I of the respective modifications can be used in place of the stand 10 of the embodiment.

Figure 22:
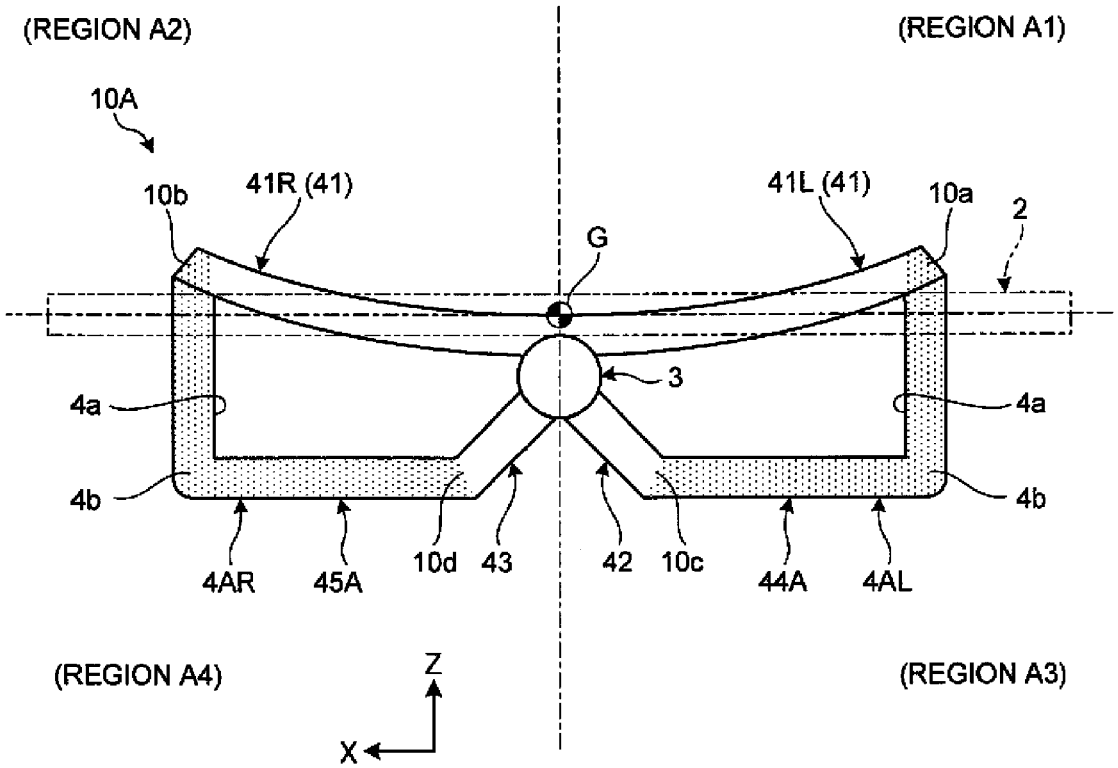
FIGS. 22 to 30 are exemplary plan views schematically illustrating a stand of a video display device according to modifications of the embodiment.

In the stand 10A according to a modification illustrated in FIG. 22, a support portion 4AL comprises the first portion 41L, the second portion 42, and a linking portion 44A. A support portion 4AR comprises the first portion 41R, the second portion 43, and a linking portion 45A. That is, the stand 10A of this modification is different from the stand 10 of the embodiment in the shape of the linking portions 44A and 45A. The linking portions 44A and 45A of the modification comprises a bent portion 4b projecting in a direction away from the housing 2 (the center of gravity G of the housing 2) and the rotating support portion 3. The linking portions 44A and 45A also have a portion along the front-back direction (the Z direction) and the horizontal direction (the X direction). In the modification, the four ends 10a to 10d are located in the same manner as described previously. Specifically, the end 10a as a placing point is arranged in the left frontal region (first position) A1, in the front view, with respect to the housing 2. The end 10b as a placing point is arranged in the right frontal region (first position) A2, in the front view, with respect to the housing 2. The end 10c as a placing point is arranged in the left back region (second position) A3, in the front view, with respect to the housing 2. The end 10d as a placing point is arranged in the right back region (second position) A4, in the front view, with respect to the housing 2. With this, the stand 10A can more stably support the video display device 1 including the housing 2 in front, back, left, and right directions. In the modification, the linking portions 44A and 45A have the bent portion 4b. With this, the video display device 1 including the housing 2 can be supported more stably in the front-back direction and in the horizontal direction.

Figure 23:
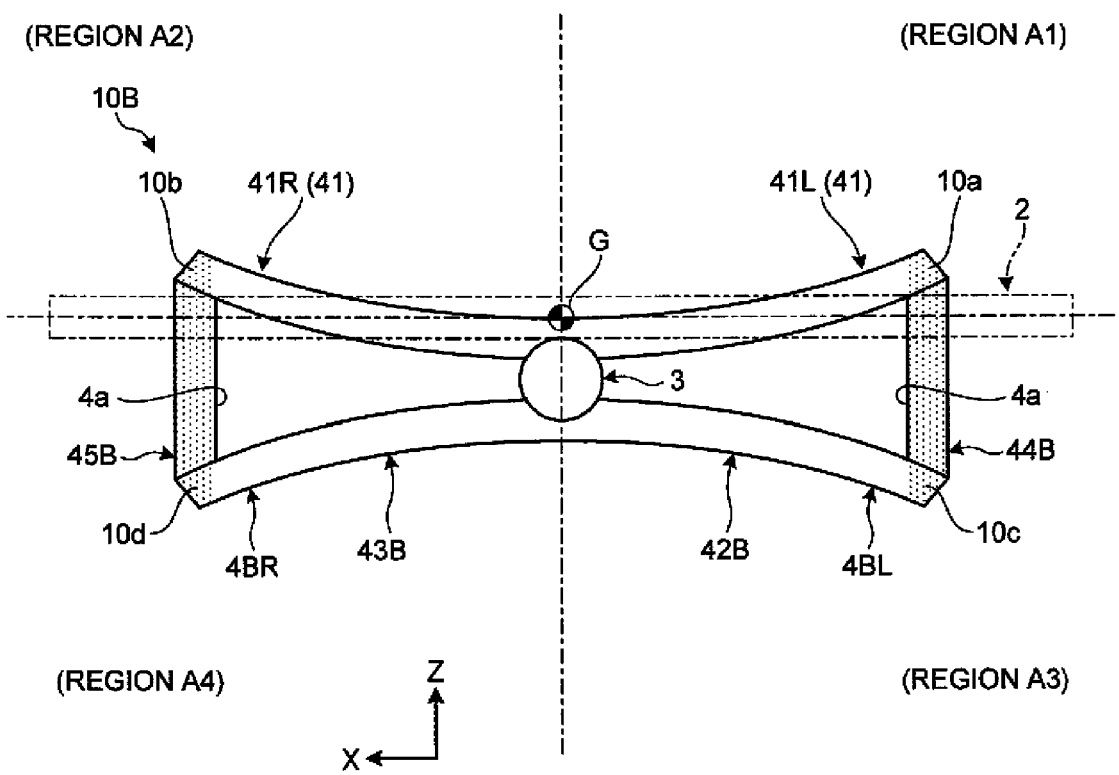

In the stand 10B according to another modification illustrated in FIG. 23, a support portion 4BL comprises the first portion 41L, a second portion 42B, and a linking portion 44B. A support portion 4BR comprises the first portion 41R, a second portion 43B, and a linking portion 45B. That is, the stand 10B of this modification is different from the stand 10 of the embodiment in the shape of the second portions 42B and 43B as well as the shape of the linking portions 44B and 45B. In the modification, the second portions 42B and 43B are in a mirror-image relation (plane symmetrical) to the first portions 41L and 41R. The linking portions 44B and 45B of the modification extend linearly along the front-back direction between the ends 10a and 10c or between the ends 10b and 10d. In the modification, the four ends 10a to 10d are located in the same manner as described previously. Specifically, the end 10a as a placing point is arranged in the left frontal region (first position) A1, in the front view, with respect to the housing 2. The end 10b as a placing point is arranged in the right frontal region (first position) A2, in the front view, with respect to the housing 2. The end 10c as a placing point is arranged in the left back region (second position) A3, in the front view, with respect to the housing 2. The end 10d as a placing point is arranged in the right back region (second position) A4, in the front view, with respect to the housing 2. With this, the stand 10B can more stably support the video display device 1 including the housing 2 in front, back, left, and right directions. Namely, the same effect as in the first embodiment can be achieved in the modification.

Figure 24:
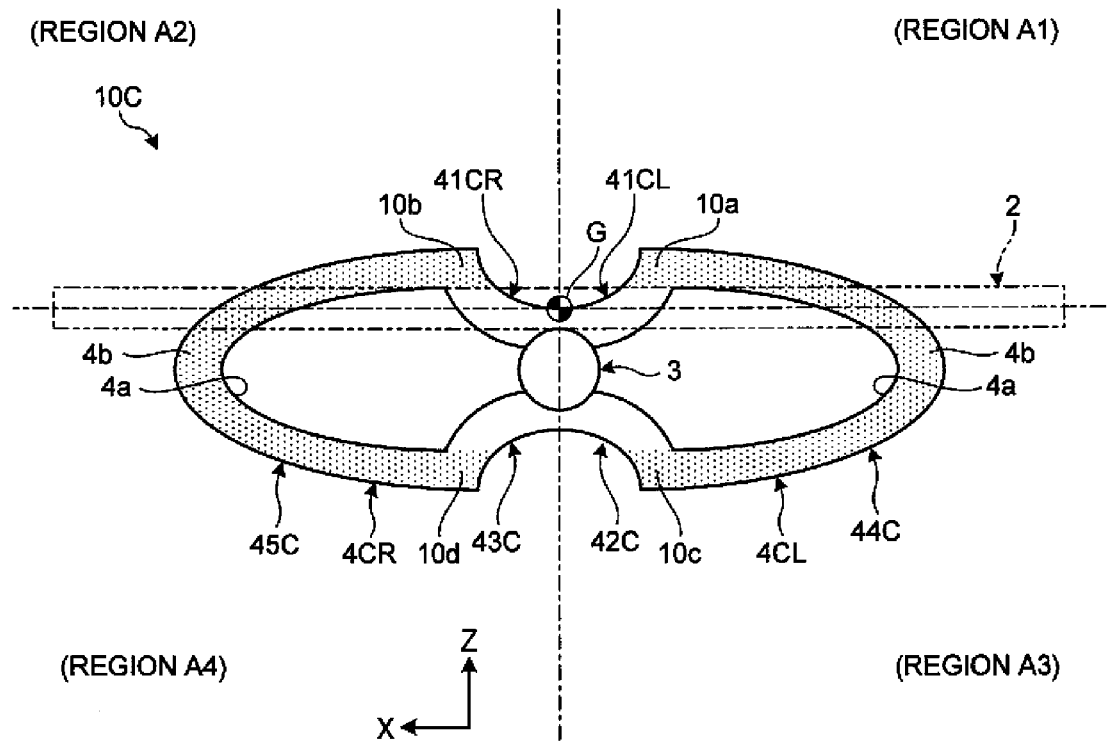

In the stand 10C according to another modification illustrated in FIG. 24, a support portion 4CL comprises a first portion 41CL, a second portion 42C, and a linking portion 44C. A support portion 4CR comprises a first portion 41CR, a second portion 43C, and a linking portion 45C. In the modification, the first portions 41CL and 41CR are in a mirror-image relation (plane symmetrical) to the second portions 42C and 43C, and they are formed in an arc with relatively a small radius of curvature. The support portions 4CL and 4CR, including the linking portions 44C and 45C, are symmetry with respect to the XY plane passing through the center of the rotating support portion 3. The linking portions 44C and 45C comprise the bent portion 4b that projects in a direction away from the housing 2 (the center of gravity G of the housing 2) and the rotating support portion 3 (the Y direction in the modification). In the modification, the four ends 10a to 10d are located in the same manner as described previously. Specifically, the end 10a as a placing point is arranged in the left frontal region (first position) A1, in the front view, with respect to the housing 2. The end 10b as a placing point is arranged in the right frontal region (first position) A2, in the front view, with respect to the housing 2. The end 10c as a placing point is arranged in the left back region (second position) A3, in the front view, with respect to the housing 2. The end 10d as a placing point is arranged in the right back region (second position) A4, in the front view, with respect to the housing 2. With this, the stand 10C can more stably support the video display device 1 including the housing 2 in front, back, left, and right directions. Namely, the same effect as in the first embodiment can be achieved in the modification.

Figure 25:
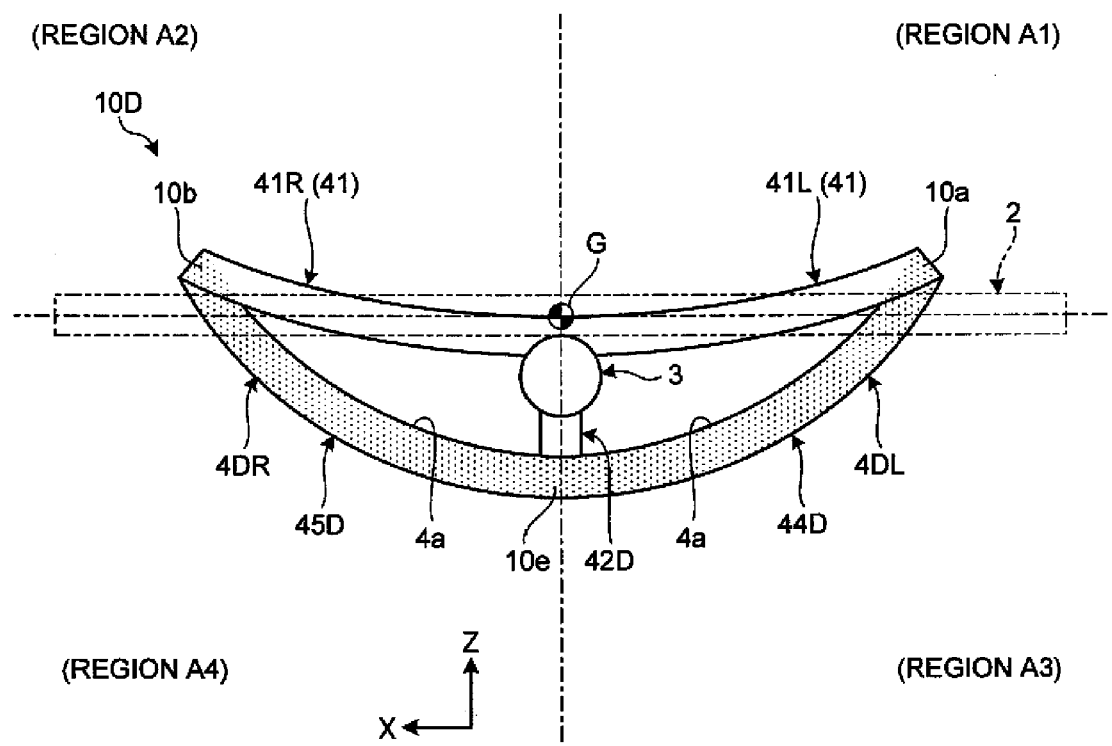

In the stand 10D according to another modification illustrated in FIG. 25, a support portion 4DL comprises the first portion 41L, a second portion 42D, and a linking portion 44D. A support portion 4DR comprises the first portion 41R, the second portion 42D, and a linking portion 45D. That is, in the modification, the second portion 42D is shared by the two support portions 4DL and 4DR. In the modification, the end 10a as a placing point is arranged in the left frontal region (first position) A1, in the front view, with respect to the housing 2. The end 10b as a placing point is arranged in the right frontal region (first position) A2, in the front view, with respect to the housing 2. An end 10e as a placing point is arranged at the boundary between the left back region (second position) A3 and the right back region (second position) A4, in the front view, with respect to the housing 2. The linking portions 44D and 45D extend forward and toward the left and right regions A1 and A2 from the regions A3 and A4 at substantially the same level as the placing point. With this, the stand 10D can more stably support the video display device 1 including the housing 2 in front, back, left, and right directions. Namely, the same effect as in the first embodiment can be achieved in the modification.

Figure 26:
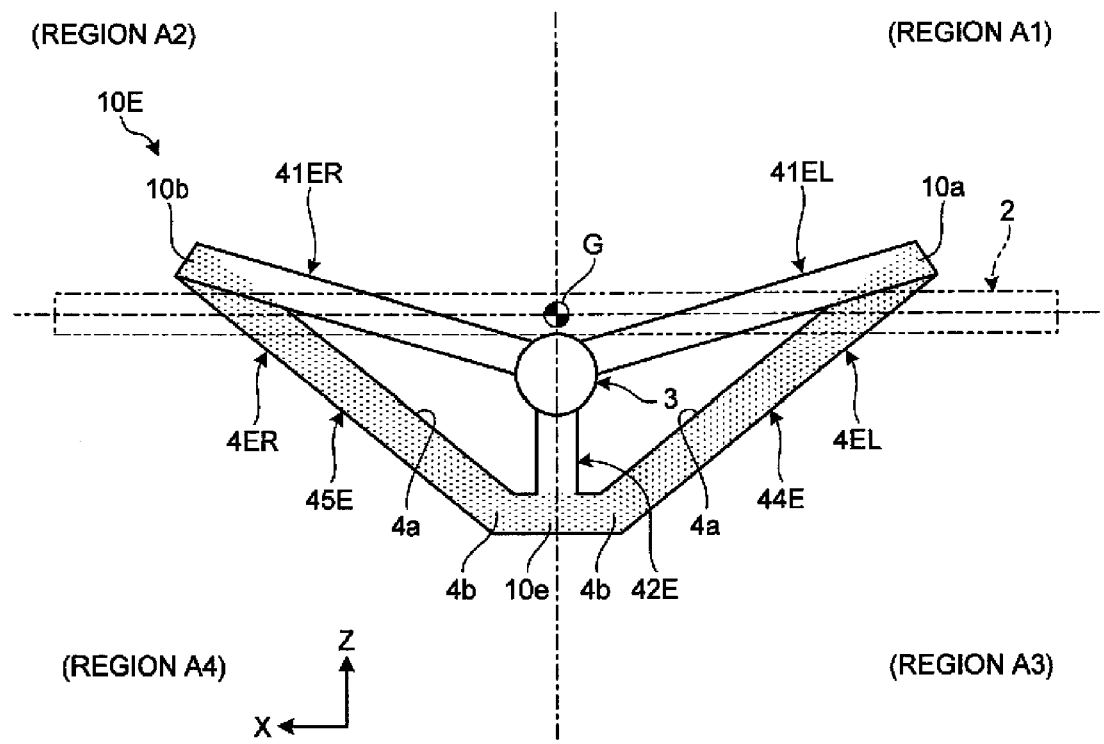

In the stand 10E according to another modification illustrated in FIG. 26, a support portion 4EL comprises a first portion 41EL, a second portion 42E, and a linking portion 44E. A support portion 4ER comprises a first portion 41ER, the second portion 42E, and a linking portion 45E. That is, in the modification, the second portion 42E is shared by the two support portions 4EL and 4ER. The stand 10E of this modification corresponds to the stand 10D illustrated in FIG. 25 in which each part is formed linearly. The respective portions are located in the regions A1 to A4 in the same manner as described previously, and accordingly, the same effect as in the modification of FIG. 25 can be achieved. Namely, the same effect as in the first embodiment can be achieved in the modification. In the modification, the linking portions 44E and 45E have the bent portion 4b, and thereby the video display device 1 including the housing 2 can be supported more stably.

Figure 27:
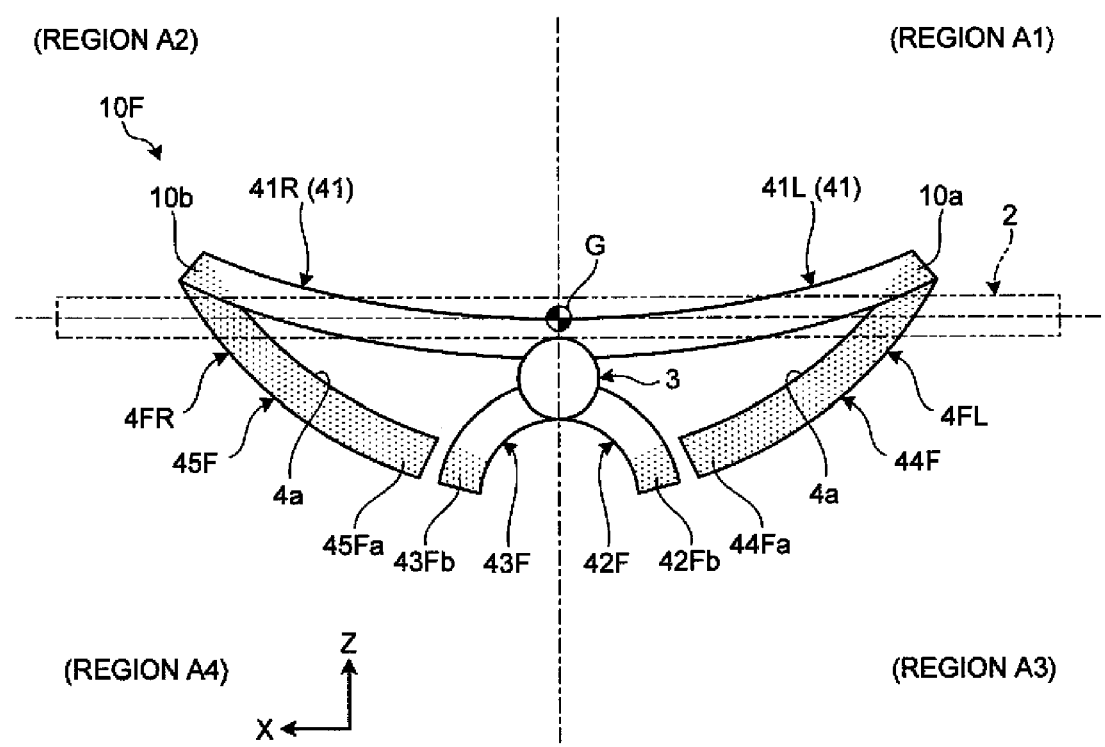

In the stand 10F according to another modification illustrated in FIG. 27, a support portion 4FL comprises the first portion 41L, a second portion 42F, and a linking portion 44F. A support portion 4FR comprises the first portion 41R, a second portion 43F, and a linking portion 45F. In the modification, the linking portions 44F and 45F are not connected to (are not continuous to) the second portions 42F and 43F, respectively. Specifically, an end 42Fb of the second portion 42F and an end (inner end) 44Fa of the linking portion 44F are apart from each other with a gap, while an end 43Fb of the second portion 43F and an end (inner end) 45Fa of the linking portion 45F are apart from each other with a gap. Since the ends (inner ends) 44Fa and 45Fa of the linking portions 44F and 45F extending from the regions A1 and A2 are located in the regions A3 and A4, respectively, the ends (inner ends) 44Fa and 45Fa in the regions A3 and A4 are connected to the rotating support portion 3 through the first portions 41L and 41R, even if the second portions 42F and 43F become nonfunctional. Thus, in the modification, the stand 10F can more stably support the housing 2, i.e., the video display device 1.

Figure 28:
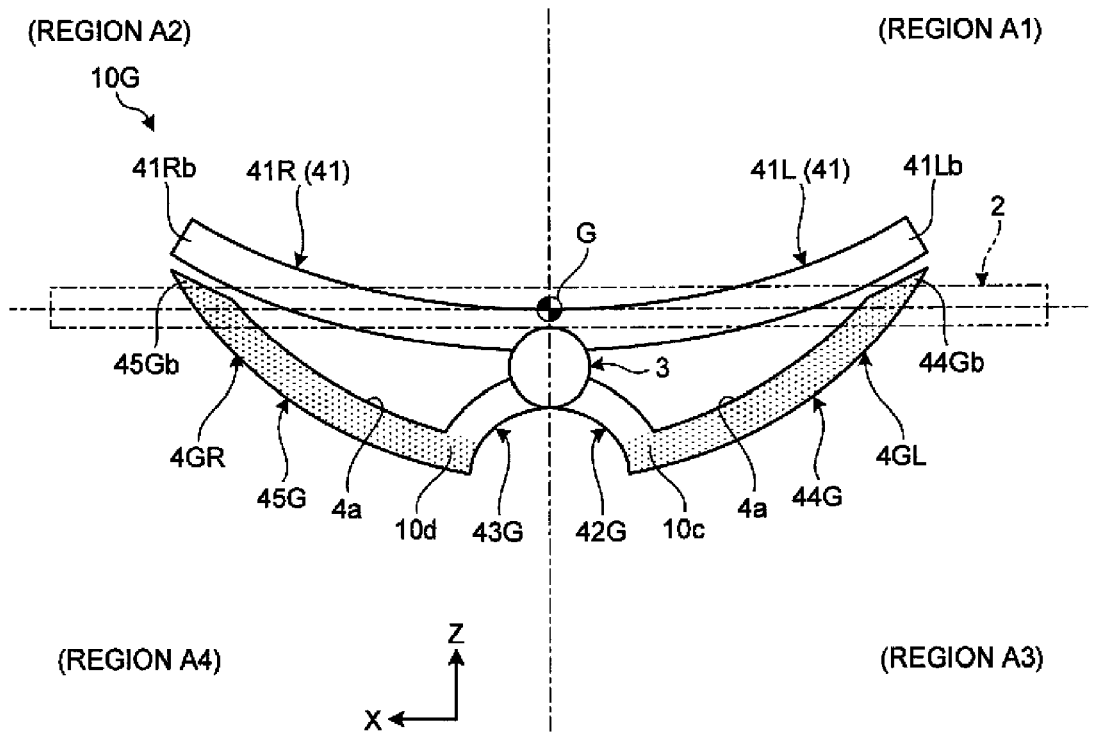

In the stand 10G according to another modification illustrated in FIG. 28, a support portion 4GL comprises the first portion 41L, a second portion 42G, and a linking portion 44G. A support portion 4GR comprises the first portion 41R, a second portion 43G, and a linking portion 45G. In the modification, the linking portions 44G and 45G are not connected to (are not continuous to) the first portions 41L and 41R, respectively. Specifically, an end 41Lb of the first portion 41L and an end (outer end) 44Gb of the linking portion 44G are apart from each other with a gap, while the end 41Rb of the first portion 41R and an end (outer end) 45Gb of the linking portion 45G are apart from each other with a gap. Since the ends (outer ends) 44Gb and 45Gb of the linking portions 44G and 45G extending from the regions A3 and A4 are located in the regions A1 and A2, respectively, the ends (outer ends) 44Gb and 45Gb in the regions A1 and A2 are connected to the rotating support portion 3 through the ends 10c and 10d and the second portions 42G and 43G, even if the first portions 41L and 41R become nonfunctional. Thus, in the modification, the stand 10G can more stably support the housing 2, i.e., the video display device 1.

Figure 29:
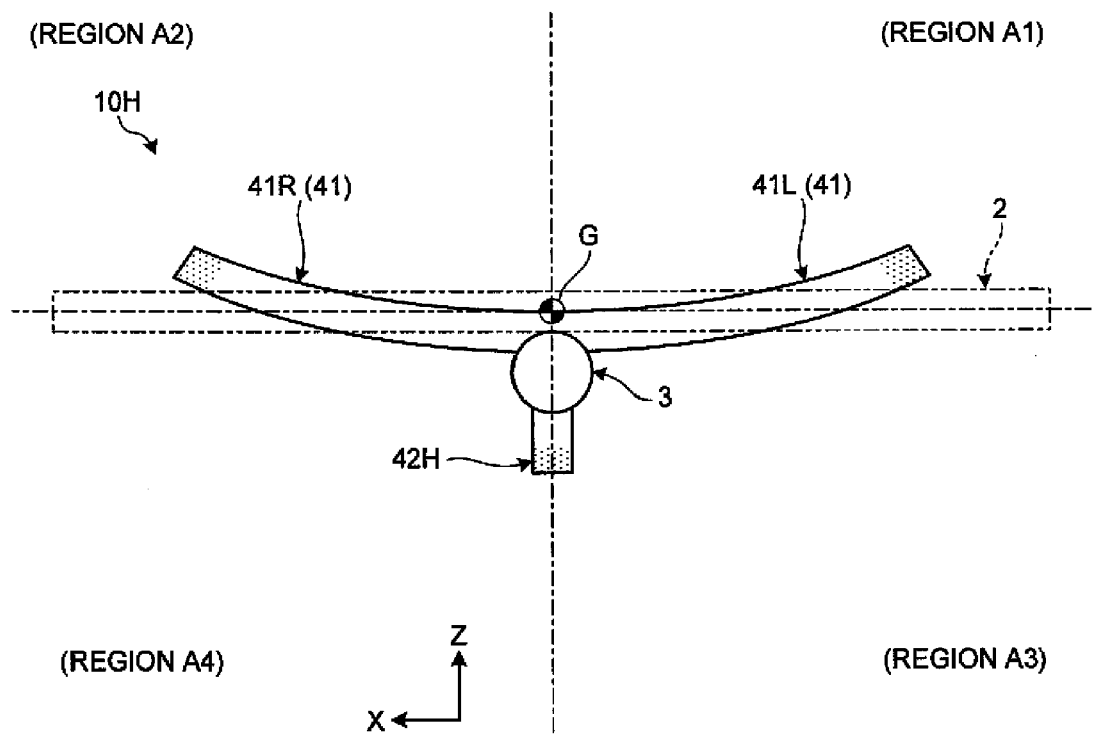
Figure 30:
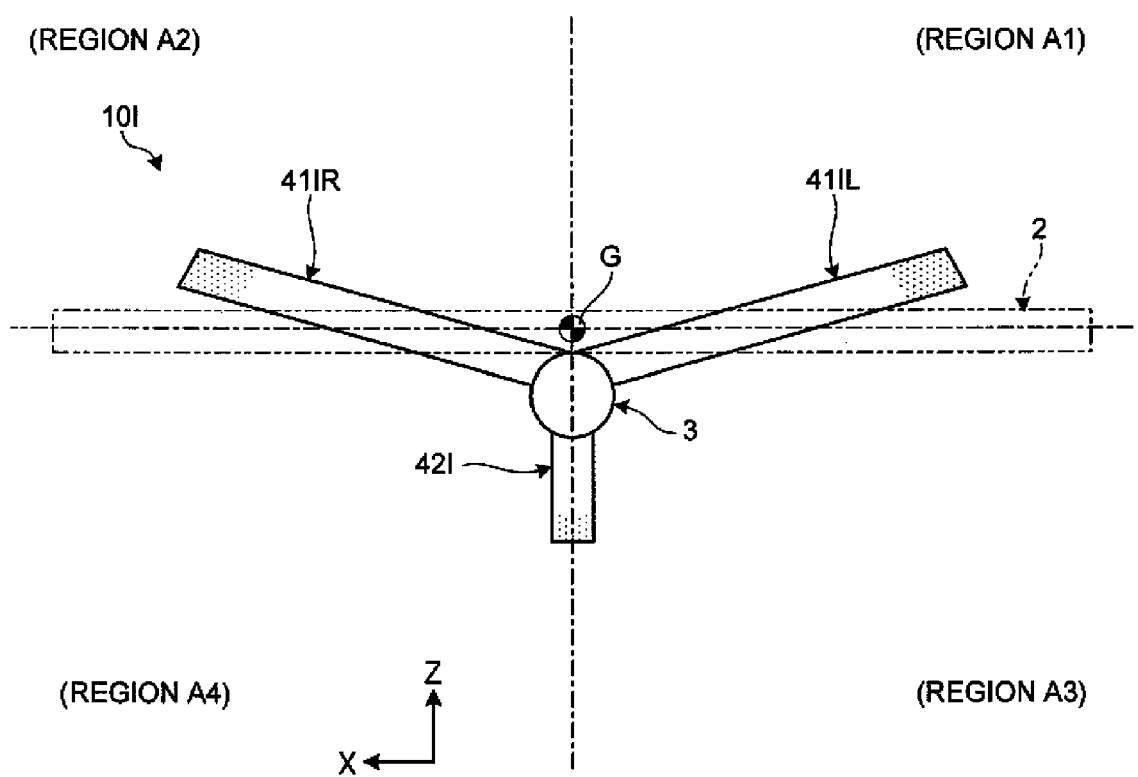

The stand 10H according to another modification illustrated in FIG. 29 comprises first portions 41L and 41R, and a second portion 42H without a linking portion. In this modification, the rotating support portion 3 is supported as being apart from the plane P when the video display device 1 is placed on the plane P. Thus, the same effect as described above can be achieved. The stand 10I according to another modification illustrated in FIG. 30 also comprises first portions 41IL and 41IR, and a second portion 42I without a linking portion. In this modification, the rotating support portion 3 is supported as being apart from the plane P when the video display device 1 is placed on the plane P. Thus, the same effect as described above can be achieved.

While the above embodiment and modifications thereof are described by way of example as being applied to a television, they may be applied to any other video display device or an electronic device such as a display device having no tuner. The first portion, the second portion, and the linking portion are not necessarily configured in a form of a leg or a bar. At least part of the linking portion can be configured to be apart from a plane when the device is placed on the plane.

The specifications (structure, shape, size, length, width, thickness, height, number, arrangement, position, material, and the like) can be suitably modified regarding the video display device, the housing, the first wall, the second wall, the first opening, the display device, the connection portion, the rotating support portion, the support portion, the second opening, the first end, the second end, the first portion, the second portion, the linking portion, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A video display device comprising:
a housing comprising a first wall and a second wall, the first wall comprising a first opening, and the second wall opposite the first wall;
a display device in the housing, the display device comprising a display screen between the first wall and the second wall and exposed from the first opening;
a rotating support portion configured to rotatably support the display device; and
a support portion comprising:
    a first end to be placed on a plane,
    a second end opposite the first end and connected to the rotating support portion,
    a linking portion between a first position close to the first wall and a second position close to the second wall, and
    a second opening between the first end and the second end, the support portion configured to support the rotating support portion to be apart from the plane where the video display device is placed such that the support portion provides a space between the rotating support portion and the plane below the rotating support portion
wherein the support portion includes a plurality of support portions
wherein one of the support portions is located on a left side or a right side of another of the plurality of support portions in the front view of the display screen,
wherein one of the first portion and the second portion of the support portion on the left side and one of the first portion and the second portion of the support portion on the right side are connected at a connection portion to the rotating support portion, and
wherein one of the first portion and the second portion of the support portion on the left side and one of the first portion and the second portion of the support portion on the right side comprise an arc shape.

* * * * *